US011804176B2

United States Patent
Liu et al.

(10) Patent No.: US 11,804,176 B2
(45) Date of Patent: Oct. 31, 2023

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cong Liu, Beijing (CN); Yao Huang, Beijing (CN); Jiachang Cai, Beijing (CN); Yudiao Cheng, Beijing (CN); Chao Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/754,108

(22) PCT Filed: May 18, 2021

(86) PCT No.: PCT/CN2021/094387
§ 371 (c)(1),
(2) Date: Mar. 24, 2022

(87) PCT Pub. No.: WO2022/001435
PCT Pub. Date: Jan. 6, 2022

(65) Prior Publication Data
US 2022/0293051 A1    Sep. 15, 2022

(30) Foreign Application Priority Data
Jun. 30, 2020 (CN) .......................... 202010623663.4

(51) Int. Cl.
*G09G 3/3225* (2016.01)
*G09G 3/3266* (2016.01)

(52) U.S. Cl.
CPC ......... *G09G 3/3225* (2013.01); *G09G 3/3266* (2013.01); *G09G 2300/0408* (2013.01);
(Continued)

(58) Field of Classification Search
None
See application file for complete search history.

(56) References Cited

U.S. PATENT DOCUMENTS 10,756,136 B1 * 8/2020 Ma .................. H01L 31/147
11,205,691 B2   12/2021 Sun et al.
(Continued)

FOREIGN PATENT DOCUMENTS

CN    106908980 A    6/2017
CN    108511489 A    9/2018
(Continued)

OTHER PUBLICATIONS

The Extended European Search Report dated Jun. 26, 2023; Appln. No. 21832139.6.

*Primary Examiner* — Sepehr Azari

(57) ABSTRACT

A display substrate and a display device, the display substrate includes a first side for displaying and a second side, and includes: a base substrate; a display region including first and second display regions, the first display region including multiple pixel unit groups, each pixel unit group including multiple first pixel units, and each first pixel unit including a pixel region and an opening region; multiple first power lines located in the pixel region; a shielding layer including a hollow region and a shielding region; for one pixel unit group, the opening region of each first pixel unit at least partially overlaps with the shielding region, the (Continued)

opening region of at least one first pixel unit includes a first shielding connecting portion at least partially overlapping with the shielding region, the shielding layer is connected with at least one first power line through the first shielding connecting portion.

20 Claims, 31 Drawing Sheets

(52) U.S. Cl.
CPC ............... *G09G 2300/0819* (2013.01); *G09G 2300/0842* (2013.01); *G09G 2320/0233* (2013.01); *G09G 2360/145* (2013.01)

(56) References Cited

U.S. PATENT DOCUMENTS

| | | | |
|---|---|---|---|
| 11,271,053 B2 | 3/2022 | Liang et al. | |
| 11,404,676 B2 | 8/2022 | Li et al. | |
| 11,411,056 B2 | 8/2022 | Ma et al. | |
| 2017/0299908 A1 | 10/2017 | Peng | |
| 2017/0317156 A1 | 11/2017 | Kim et al. | |
| 2019/0130822 A1* | 5/2019 | Jung | H10K 59/60 |
| 2019/0131371 A1* | 5/2019 | Yi | H10K 59/123 |
| 2019/0280059 A1 | 9/2019 | Tang et al. | |
| 2020/0161399 A1 | 5/2020 | Park et al. | |
| 2020/0312926 A1* | 10/2020 | Bae | H10K 59/131 |
| 2022/0158140 A1 | 5/2022 | Liu et al. | |

FOREIGN PATENT DOCUMENTS

| | | |
|---|---|---|
| CN | 110061014 A | 7/2019 |
| CN | 110265448 A | 9/2019 |
| CN | 110299397 A | 10/2019 |
| CN | 110365819 A | 10/2019 |
| CN | 110660835 A | 1/2020 |
| CN | 110729313 A | 1/2020 |
| CN | 110867476 A | 3/2020 |
| CN | 111129102 A | 5/2020 |
| CN | 111211152 A | 5/2020 |

* cited by examiner

SCP

LY1

DISPLAY SUBSTRATE AND DISPLAY DEVICE

This application is a National Stage of International Application No. PCT/CN2021/094387, filed May 18, 2021, which claims priority to and the benefit of Chinese Patent Application No. 202010623663.4, filed Jun. 30, 2020, the entireties of which are hereby incorporated herein by reference.

TECHNICAL FIELD

At least one embodiment of the present disclosure relates to a display substrate and a display device.

BACKGROUND

Based on the design of a camera under panel, a display panel generally includes a high Pixels Per Inch (PPI) region and a low PPI region, but generally, the display panel has a relatively low light transmittance in the low PPI region, which is not beneficial for improving the display effect of the camera in an imaging region.

SUMMARY

At least one embodiment of the present disclosure provides a display substrate, the display substrate has a first side for displaying and a second side opposite to the first side and comprises: a base substrate; a display region, disposed on the base substrate and includes a first display region and a second display region at least partially surrounding the first display region, wherein the first display region allows light from the first side of the display substrate to be at least partially transmitted to the second side of the display substrate for sensing, the first display region includes a plurality of pixel unit groups arranged at intervals, each of the plurality of pixel unit groups includes a plurality of first pixel units, and each of the plurality of first pixel units includes a pixel region and an opening region; a plurality of first power lines, located in the pixel region and configured to be connected with the plurality of pixel unit groups, to provide a first power voltage to the plurality of pixel unit groups; and a shielding layer, disposed on the base substrate, located on a side of the plurality of first power lines close to the base substrate, and including a hollow region and a shielding region, and for one pixel unit group of the plurality of pixel unit groups, the opening region of each of the plurality of first pixel units at least partially overlaps with the shielding region of the shielding layer, the opening region of at least one of the plurality of first pixel units includes a first shielding connecting portion at least partially overlapping with the shielding region of the shielding layer, the shielding layer is connected with at least one of the plurality of first power lines through the first shielding connecting portion, to receive the first power voltage; and the plurality of first power lines are located on a side of the first shielding connecting portion away from the base substrate, the shielding layer is located on a side of the first shielding connecting portion close to the base substrate, and the first shielding connecting portion is located between the shielding layer and the plurality of first power lines.

For example, in the display substrate provided by at least one embodiment of the present disclosure, the shielding layer is connected with the first shielding connecting portion through a first through hole and the first shielding connecting portion is connected with the at least one of the plurality of first power lines through a second through hole.

For example, in the display substrate provided by at least one embodiment of the present disclosure, the display substrate further comprises a first insulating layer, a second insulating layer and a third insulating layer, the first insulating layer is located between the shielding layer and the first shielding connecting portion, the second insulating layer is located between the first insulating layer and the first shielding connecting portion and the third insulating layer is located between the first shielding connecting portion and the plurality of first power lines; or, the second insulating layer is located between the first shielding connecting portion and the plurality of first power lines, the third insulating layer is located between the second insulating layer and the plurality of first power lines, the shielding layer is connected with the first shielding connecting portion by the first through hole passing through the first insulating layer and the first shielding connecting portion is connected with the at least one of the plurality of first power lines by the second through hole passing through the second insulating layer and the third insulating layer; or, the shielding layer is connected with the first shielding connecting portion by the first through hole passing through the first insulating layer and the second insulating layer and the first shielding connecting portion is connected with the at least one of the plurality of first power lines by the second through hole passing through the third insulating layer.

For example, in the display substrate provided by at least one embodiment of the present disclosure, orthogonal projections of the first through hole and the second through hole on the base substrate do not overlap; and the first power line includes a protruding portion, an orthogonal projection of the second through hole on the base substrate overlaps with an orthogonal projection of the protruding portion on the base substrate, and an orthogonal projection of the first through hole on the base substrate overlaps with an orthogonal projection of the first power line on the base substrate.

For example, in the display substrate provided by at least one embodiment of the present disclosure, the adjacent pixel unit groups are connected through a wire, and orthogonal projections of the plurality of pixel unit groups and the wire on the base substrate fall within an orthogonal projection of the shielding region of the shielding layer on the base substrate.

For example, in the display substrate provided by at least one embodiment of the present disclosure, the second display region includes a plurality of second pixel units arranged in an array and a plurality of second power lines and each of the plurality of second pixel units includes a pixel region and an opening region; and the plurality of second power lines are configured to be connected with the plurality of second pixel units, to provide a second power voltage to the plurality of second pixel units, and the second power voltage is a same with the first power voltage, and for one of the plurality of second pixel units, the opening region of each of the plurality of second pixel units at least partially overlaps with the shielding region of the shielding layer, the opening region of the at least one of the plurality of second pixel units includes a second shielding connecting portion and the second shielding connecting portion at least partially overlaps with the shielding region of the shielding layer.

For example, in the display substrate provided by at least one embodiment of the present disclosure, an orthogonal projection of the second display region on the base substrate falls within the orthogonal projection of the shielding region of the shielding layer on the base substrate.

For example, in the display substrate provided by at least one embodiment of the present disclosure, each of the plurality of first pixel units and the plurality of second pixel units includes a pixel driving circuit and a light-emitting member and the pixel driving circuit is configured to drive the light-emitting member to emit light.

For example, in the display substrate provided by at least one embodiment of the present disclosure, the pixel driving circuit includes a driving transistor, a data writing transistor, a compensation transistor, a first light-emitting control transistor, a second light-emitting control transistor, a first reset transistor, a second reset transistor, and a storage capacitor; active layers of the first reset transistor, the compensation transistor, the second light-emitting control transistor, and the second reset transistor are located in a first semiconductor layer extending along a first direction, active layers of the data writing transistor and the first light-emitting control transistor are located in a second semiconductor layer extending along a second direction, the first semiconductor layer and the second semiconductor layer are connected through an active layer of the driving transistor and integrally formed, the active layer of the driving transistor is located on an imaginary line of the active layer of the first reset transistor in the first direction, the active layers of the compensation transistor and the data writing transistor are respectively located on both sides of the active layer of the driving transistor and located on a side of the active layer of the driving transistor close to the active layer of the first reset transistor, the active layers of the second light-emitting control transistor and the first light-emitting control transistor are respectively located on both sides of the active layer of the driving transistor and located on a side of the active layer of the driving transistor away from the active layer of the first reset transistor, the active layer of the second reset transistor is located on a side of the active layer of the second light-emitting control transistor away from the active layer of the compensation transistor, the compensation transistor includes a first gate electrode extending along the first direction and a second gate electrode extending along the second direction, the second gate electrode is arranged in the first direction side by side with a gate electrode of the second light-emitting control transistor and a gate electrode of the second reset transistor which extend along the second direction, a gate electrode of the data writing transistor and a gate electrode of the first light-emitting control transistor extend along the second direction and are arranged side by side in the first direction, a gate electrode of the first reset transistor and a gate electrode of the driving transistor extend along the second direction and are arranged side by side in the first direction, and the gate electrode of the driving transistor and a first polar plate of the storage capacitor are integrally formed.

For example, the display substrate provided by at least one embodiment of the present disclosure further comprises a gate line, a light-emitting control signal line, a first reset signal line, and a second reset signal line which extend along the second direction, the gate electrode of the first reset transistor and the first reset signal line are connected and integrally formed, the second gate electrode of the compensation transistor and the gate electrode of the data writing transistor are connected with the gate line and are integrally formed with the gate line, the gate electrode of the second light-emitting control transistor and the gate electrode of the first light-emitting control transistor are connected with the light-emitting control signal line and are integrally formed with the light-emitting control signal line, and the gate electrode of the second reset transistor and the second reset signal line are connected and integrally formed.

For example, the display substrate provided by at least one embodiment of the present disclosure further comprises a data line, the data line is connected with the active layer of the data writing transistor and configured to provide a data signal, the orthogonal projection of the first power line on the base substrate at least partially overlaps with orthogonal projections of the active layer of the first reset transistor and the active layer of the driving transistor on the base substrate, and an orthogonal projection of the data line on the base substrate is located on a side of an orthogonal projection of the second semiconductor layer on the base substrate away from the orthogonal projection of the first power line on the base substrate.

For example, in the display substrate provided by at least one embodiment of the present disclosure, the pixel driving circuit further includes a first transfer electrode, the first transfer electrode is connected with the active layer of the second light-emitting control transistor, the active layer of the second reset transistor, and a first electrode of the light-emitting member by a through hole, and an orthogonal projection of the first transfer electrode on the base substrate is located between orthogonal projections of the active layer of the second reset transistor and the active layer of the driving transistor on the base substrate.

For example, in the display substrate provided by at least one embodiment of the present disclosure, for each of the plurality of second pixel units, an orthogonal projection of the second shielding connecting portion on the base substrate is located between the orthogonal projection of the active layer of the second reset transistor on the base substrate and an orthogonal projection of the second power line on the base substrate and at least partially overlaps with the orthogonal projection of the second power line on the base substrate.

For example, in the display substrate provided by at least one embodiment of the present disclosure, for each pixel unit group, the first shielding connecting portion is located between two adjacent first pixel units in the first direction in each pixel unit group.

For example, in the display substrate provided by at least one embodiment of the present disclosure, an orthogonal projection of the first shielding connecting portion on the base substrate is located between the orthogonal projection of the active layer of the second reset transistor on the base substrate and an orthogonal projection of the first power line on the base substrate and at least partially overlaps with the orthogonal projection of the first power line on the base substrate.

For example, in the display substrate provided by at least one embodiment of the present disclosure, the first shielding connecting portions are respectively located at both ends of each pixel unit group and connected with at least one of a plurality of first power lines respectively corresponding to the each pixel unit group.

For example, in the display substrate provided by at least one embodiment of the present disclosure, the first shielding connecting portion is respectively located at an end of each pixel unit group and connected with at least one of a plurality of first power lines corresponding to the pixel unit group.

For example, the display substrate provided by at least one embodiment of the present disclosure further comprises a fourth insulating layer, a first conductive layer, a second conductive layer, and a third conductive layer, the first conductive layer includes the gate line, the second conductive layer includes a second polar plate of the storage capacitor, the third conductive layer includes the first power line; in a direction perpendicular to the base substrate, the fourth insulating layer is located between the shielding layer and the active layer of the transistor, the first insulating layer is located between the active layer and the first conductive layer, the second insulating layer is located between the gate line and the second conductive layer, and the third insulating layer is located between the second polar plate of the storage capacitor and the third conductive layer.

For example, in the display substrate provided by at least one embodiment of the present disclosure, the first shielding connecting portion is located in the first conductive layer or the second conductive layer.

At least one embodiment of the present disclosure provides a display device, the display device comprises the display substrate provided by any embodiment of the present disclosure and a sensor, the sensor is arranged on the second side of the display substrate and the sensor is configured to receive light from the first side of the display substrate; and an orthogonal projection of the sensor on the base substrate at least partially overlaps with the first display region.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the invention and thus are not limitative of the invention.

DETAILED DESCRIPTION

Figure 1A:
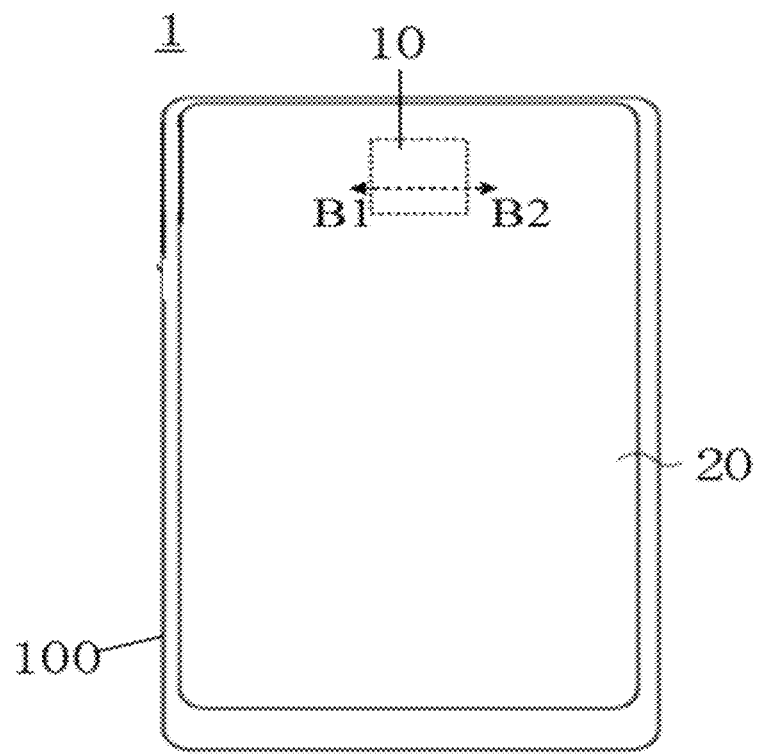
FIG. 1A is a schematic plan view of a display substrate provided by at least one embodiment of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

An Organic Light-Emitting Diode (OLED) display technology has strong competitiveness in displays due to its advantages of wide viewing angle, high contrast, fast response, low power consumption, foldability, flexibility, and the like. With extensive development and deep application of the OLED technology, the demand for a display screen with a relatively high screen-to-body ratio is stronger and stronger. A front camera of a camera under panel technology is located under a screen, so a notch region for arranging the front camera can be eliminated, which improves the screen-to-body ratio and has a better visual experience.

In order to make more light reach the front camera through the display panel, the PPI of a light-transmitting display region of the screen needs to be reduced, i.e., pixels per inch need to be reduced, but there are many slits between wires of the pixel circuit and between connecting lines of signal lines among the pixels. When the light passes through these slits, diffraction and interference may occur, which results in uneven brightness when the light reaches the camera, generates glare phenomenon (excessive brightness in a certain local region of the visual field or excessive brightness changing before and after), reduces the visibility of an object, decreases the imaging quality of the camera, and is liable to cause visual fatigue.

Currently, one solution is that: one metal layer is added to serve as a shielding layer for shielding a pixel circuit and a wire position, so as to prevent the light from passing through these slits to cause interference; but these metal layers may cause signal interference to the pixel circuit due to being in a floating state, resulting in influence on the display effect. Therefore, a direct-current signal needs to be input into these metal layers, to stabilize the voltage. However, if the pixel circuit is directly perforated for connection, a space is required for disposing a connecting hole, so the pixel size may be increased and the resolution of the screen may be reduced; and if connection is carried out only from an Integrated Chip (IC) end, a high wire voltage drop may be caused and the display quality is influenced.

At least one embodiment of the present disclosure provides a display substrate, having a first side for displaying and a second side opposite to the first side, including: a base substrate; a display region, which is disposed on the base substrate and includes a first display region and a second display region at least partially surrounding the first display region, the first display region allows light from the first side of the display substrate to be at least partially transmitted to the second side of the display substrate for sensing, the first display region includes a plurality of pixel unit groups arranged at intervals, each of the plurality of pixel unit groups includes a plurality of first pixel units, and each of the plurality of first pixel units includes a pixel region and an opening region; a plurality of first power lines, which are located in the pixel region, and configured to be connected with the plurality of pixel unit groups to provide a first power voltage to the plurality of pixel unit groups; and a shielding layer, which is disposed on the base substrate, is located on a side of the first power line close to the base substrate, and includes a hollow region and a shielding region. For one pixel unit group, the opening region of each first pixel unit at least partially overlaps with the shielding region of the shielding layer, the opening region of at least one first pixel unit includes a first shielding connecting portion which at least partially overlaps with the shielding region of the shielding layer, and the shielding layer is connected with at least one of the plurality of first power lines through the first shielding connecting portion so as to receive the first power voltage; and the plurality of first power lines are located on a side of the first shielding connecting portion away from the base substrate, the shielding layer is located on a side of the first shielding connecting portion close to the base substrate, and the first shielding connecting portion is located between the shielding layer and the plurality of first power lines.

For the display substrate provided by an embodiment of the present disclosure, on the premise of not reducing the PPI, a direct-current signal can be connected to the shielding layer, to prevent the shielding layer from being in a floating state, thereby preventing the signal jumping of the shielding layer from causing interference to a pixel driving circuit, and meanwhile reducing the voltage drop of the first power line, and improving the display quality of a display panel.

The embodiments of the present disclosure will be illustrated in detail below in combination with the drawings.

Figure 1B:
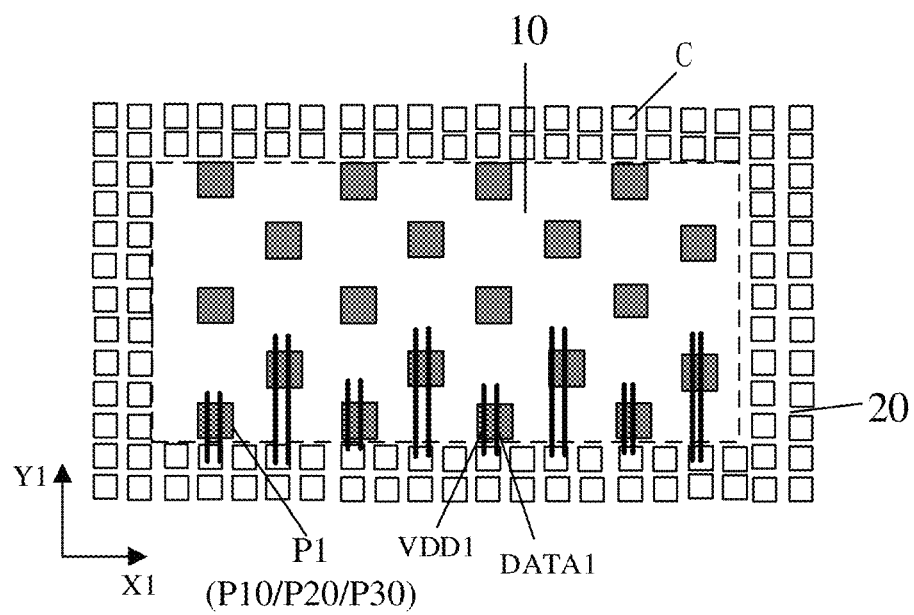
FIG. 1B is a partially enlarged schematic diagram of a display substrate provided by at least one embodiment of the present disclosure.
Figure 1C:
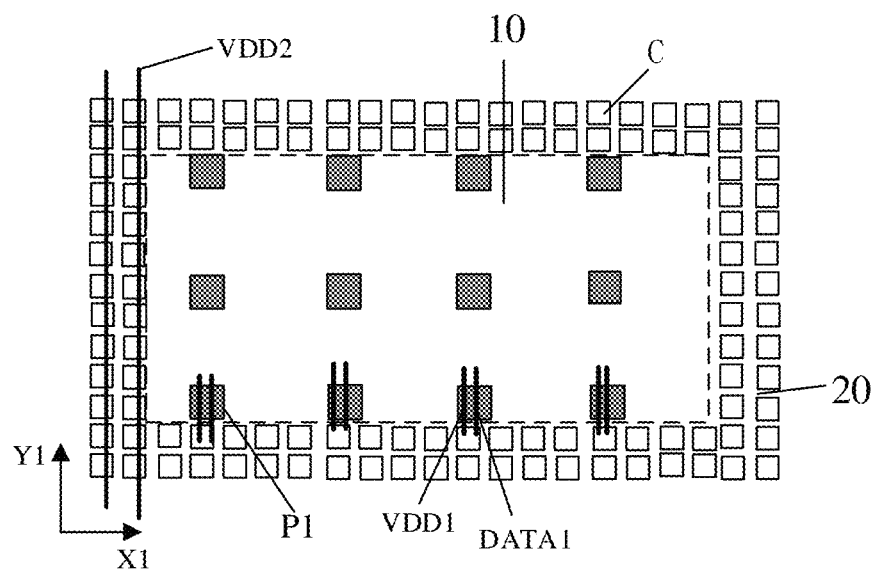
FIG. 1C is a partially enlarged schematic diagram of a display substrate provided by at least another embodiment of the present disclosure.

FIG. 1A is a schematic plan view of a display substrate provided by at least one embodiment of the present disclosure; FIG. 1B is a partially enlarged schematic diagram of a display substrate provided by at least one embodiment of the present disclosure; FIG. 1C is a partially enlarged schematic diagram of a display substrate provided by at least another embodiment of the present disclosure; and FIG. 1D is a schematic cross-sectional diagram along a line B1-B2 shown in FIG. 1A.

For example, as shown in FIG. 1A, the display substrate 1 provided by at least one embodiment of the present disclosure includes a base substrate 100 and a display region. The display region is disposed on the base substrate 100 and the display region includes a first display region 10 (e.g., a light-transmitting display region) and a second display region 20 (e.g., a normal display region). The display substrate 1 may further include a peripheral region 30 and the peripheral region 30 surrounds (for example, partially surrounds) the display region. The second display region 20 surrounds (for example, partially surrounds) the first display region 10.

For example, the display substrate 1 provided by at least one embodiment of the present disclosure may be a display substrate, such as an OLED display substrate, or a Quantum dot Light-Emitting Diode (QLED) display substrate, and the like, and the embodiments of the present disclosure do not make any limit to the specific type of the display substrate.

Figure 1D:
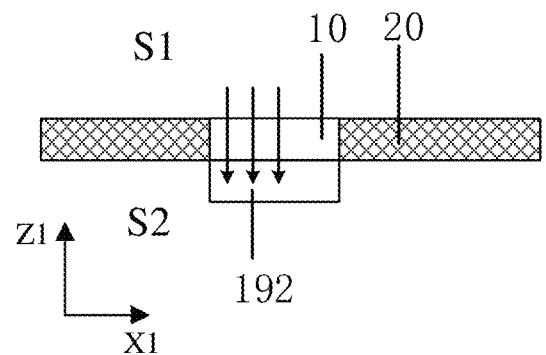
FIG. 1D is a schematic cross-sectional diagram along a line B1-B2 shown in FIG. 1A.

For example, as shown in FIG. 1D, the first display region 10 is a light-transmitting display region, i.e., it allows light from a first side S1 (e.g., a display side) of the display substrate 1 to be at least partially transmitted to a second side S2 (e.g., a non-display side) of the display substrate 1, that is to say, incident light from the display side is transmitted to pass through the first display region 10 to reach the non-display side of the display substrate 1. A sensor 192 may also be arranged on the second side S2 of the display substrate 1 to receive the transmitted light, so as to achieve the corresponding functions (e.g., imaging, infrared sensing, distance sensing, and the like). For example, the sensor 192 is arranged on the second side 2 of the display substrate 1, an orthogonal projection of the sensor 192 on the base substrate 100 at least partially overlaps with the first display region 10, and the sensor 192 is configured to receive and process the light from the first side S1 of the display substrate 1. The light from the first side S1 of the display substrate 1 may be collimated light along a normal direction (e.g., a Z1 direction) of the display substrate 1, or may be an uncollimated light.

For example, the sensor 192 is an image sensor, an infrared sensor, a distance sensor, or the like, and the sensor 192, for example, may be implemented in a form of a chip and the like. The sensor 192 is arranged on the second side S2 (a side face away from a user) of the display substrate 1. The sensor 192 and the first display region 10 at least partially overlap in a normal direction of a display surface of the display substrate.

For example, the sensor 192 may be an image sensor, and may be used for acquiring an image of an external environment which is faced by a light collecting face of the sensor 192, for example, may be a Complementary Metal Oxide Semiconductor (CMOS) image sensor or a Charge Coupled Device (CCD) image sensor; and the sensor 192 may also be an infrared sensor, a distance sensor, or the like. The sensor 192 may be used for implementing a camera of a mobile terminal such as a mobile phone and a laptop, and as required, may also include optical members such as a lens, a reflector or an optical waveguide, and the like so as to carry out modulation on a light path. The embodiments of the present disclosure do not make any limit to the type, function and setting mode of the sensor 192.

The sensor 192 is arranged on the first side S2 of the display substrate by means of a double-sided adhesive or the like, the orthogonal projection of the sensor 192 on the base substrate 100 at least partially overlaps with the first display region 10, and the sensor 192 is configured to receive the light from the first side S1. Therefore, while achieving display, the first display region 10 also facilitates arrangement of the sensor 192.

For example, as shown in FIG. 1B and FIG. 1C, the first display region 10 includes a first sub-pixel array (which is composed of gray boxes in the first display region 10), and the first sub-pixel array includes a plurality of pixel unit groups P1 (the gray boxes in the first display region 10) arranged in a first direction Y1 and a second direction X1 intersecting with the first direction Y1. Each of the plurality of pixel unit groups P1 includes at least one first pixel unit (e.g., a plurality of first pixel units) (described in detail later). The first pixel unit includes a first light-emitting member and a first pixel driving circuit which are directly connected with each other, and the first pixel driving circuit is configured to drive the first light-emitting member to emit light. The first light-emitting member and the first pixel driving circuit are located in the same pixel region, and are not separated from each other in position.

It should be noted that the first direction Y1 and the second direction X1 may perpendicularly intersect with each other, or may not be perpendicularly intersect with each other; for example, the value range of the acute angle formed by mutual intersection of the first direction Y1 and the second direction X1 may be less than or equal to 10° and greater than or equal to 45°. In the drawings of the embodiments of the present disclosure, perpendicular intersection of the first direction Y1 and the second direction X1 is taken as an example.

There are gaps allowing the light to pass through, i.e., blank regions in the first display region 10, among the plurality of pixel unit groups P1, to allow the incident light from the first side S1 to be transmitted through the gaps between the adjacent pixel unit groups P1 in order to ensure light transmittance of the first display region 10.

For example, as shown in FIG. 1B, the plurality of first pixel unit groups P1 are arranged into two adjacent columns being staggered to each other, i.e., in the drawing, a first column of pixel unit groups P1 and a second column of pixel unit groups P1 are staggered in the second direction X1 to be distributed in different rows. For example, the adjacent columns of pixel unit groups P1 are located in different rows.

For example, as shown in FIG. 1C, the plurality of pixel unit groups P1 are arranged into a plurality of rows and a plurality of columns, i.e., in the drawing, the first column of pixel unit groups P1 and the second column of pixel unit groups P1 are adjacent at intervals in the second direction X1.

For example, as shown in FIG. 1B and FIG. 1C, the second display region 20 includes a second sub-pixel array (which is composed of white boxes in the second display region 20), and the second sub-pixel array includes a plurality of second pixel units C (the white boxes in the second display region 20). Each of the plurality of second pixel units C includes a second light-emitting member and a second pixel driving circuit which are directly connected with each other, and the second pixel driving circuit is configured to drive the second light-emitting member to emit light. The second light-emitting member and the second pixel driving circuit are located in the same pixel region, and are not separated from each other in position. For example, an arranging mode of the second pixel units in the second display region 20 is as shown in FIG. 2.

For example, the PPI of the second display region is greater than the PPI of the first display region, as shown in FIG. 1B and FIG. 1C, the arrangement density of the pixel unit groups P1 in the first display region 10 is less than that of the second pixel units C in the second display region 20. Namely, the resolution of the first display region 10 is set to be lower than that of the second display region 20, to reserve a space for allowing the light to pass through, i.e., the PPI for display, which is arranged in the first display region 10, is less than the PPI in the second display region 20.

Figure 2:
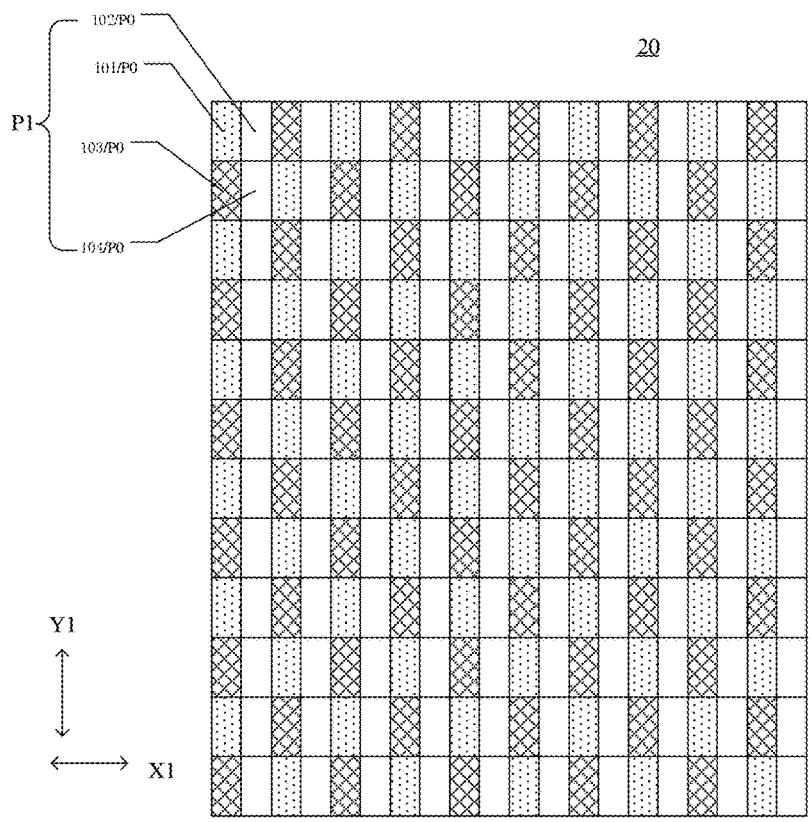
FIG. 2 is an arrangement schematic diagram of pixel units of a second display region provided by at least one embodiment of the present disclosure.
Figure 3:
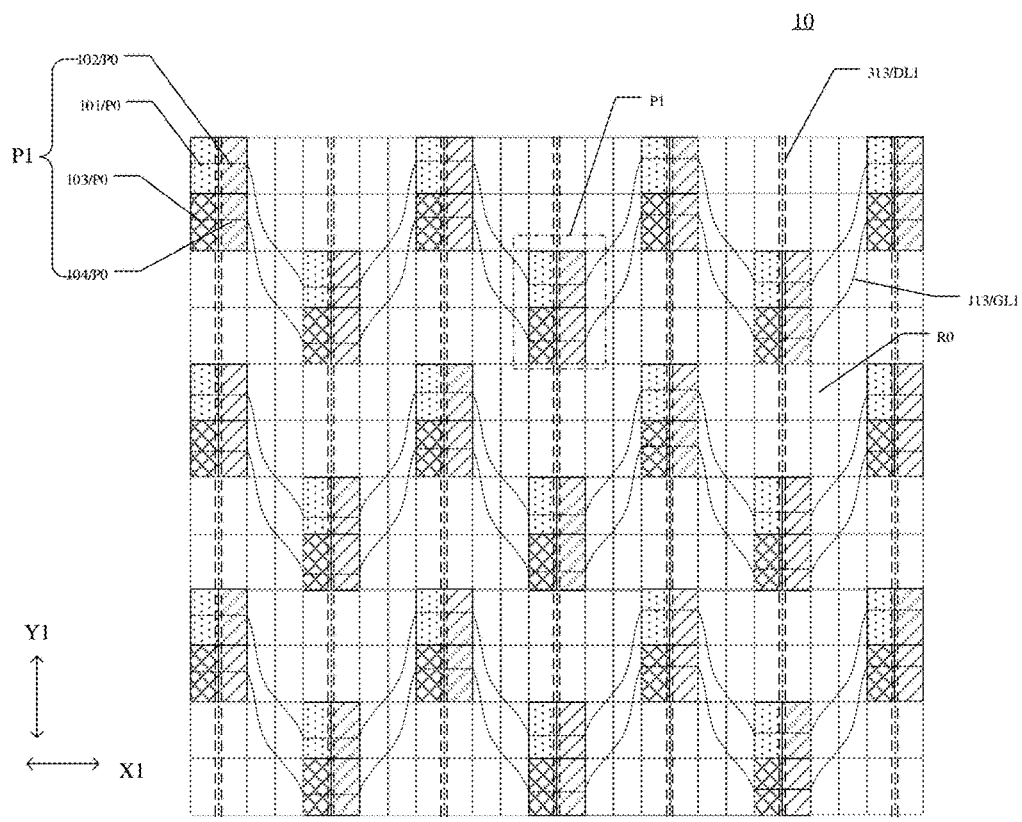
FIG. 3 is a schematic diagram of a first display region of a display panel provided by at least one embodiment of the present disclosure.

FIG. 2 is a schematic arrangement diagram of pixel units of a second display region provided by at least one embodiment of the present disclosure. FIG. 3 is a schematic diagram of a first display region of a display panel provided by at least one embodiment of the present disclosure. As shown in FIG. 2 and FIG. 3, the first display region 10 and the second display region 20 of a display substrate respectively include a plurality of pixel unit groups P1, for example, it is only schematically shown in FIG. 2 and FIG. 3 that each pixel unit group P1 includes four pixel units P0, for example, the fourth pixel units P0 respectively are a first sub-pixel unit 101, a second sub-pixel unit 102, a third sub-pixel unit 103, and a fourth sub-pixel unit 104, and the embodiments of the present disclosure do not make any limit thereto.

It should be noted that each pixel unit group P1 may also include two pixel units P0 (as shown in FIG. 14A to FIG. 14E) or three pixel units P0 (as shown in FIG. 15A to FIG. 15E), and the like, which is not limited by the embodiments of the present disclosure.

Figure 14A:
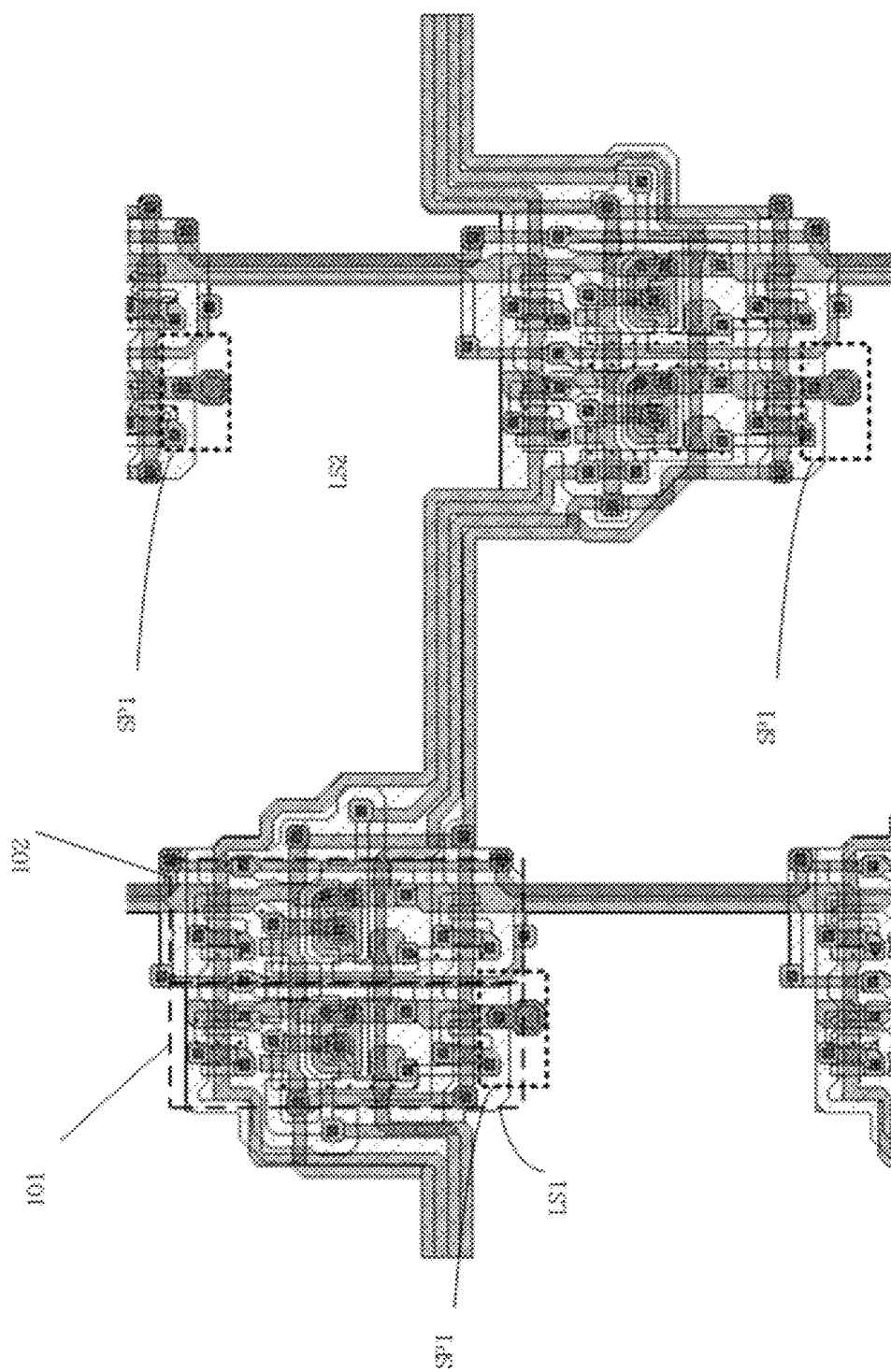
FIG. 14A is a schematic diagram of one example of yet another display substrate provided by at least one embodiment of the present disclosure.

For example, in an example shown in FIG. 14A, one pixel group may also include two sub-pixels and for example, include a first sub-pixel 101 and a second sub-pixel 102; for example, the first sub-pixel 101 is a red sub-pixel, and the second sub-pixel 102 is a green sub-pixel. For example, in an embodiment shown in FIG. 15A, one first pixel group P1 may also include three sub-pixels and for example, include a first sub-pixel 101, a second sub-pixel 102, and a third sub-pixel 103; for example, the first sub-pixel 101 is a red sub-pixel, the second sub-pixel 102 is a green sub-pixel, the third sub-pixel 103 is a blue sub-pixel; and for example, the three sub-pixels are located in one row. For example, in an example shown in FIG. 12A, one pixel group may also include four sub-pixels and for example, include a first sub-pixel 101, a second sub-pixel 102, a third sub-pixel 103, and a fourth sub-pixel 104; for example, the first sub-pixel 101 is a red sub-pixel, the second sub-pixel 102 is a green sub-pixel, the third sub-pixel 103 is a blue sub-pixel, and the fourth sub-pixel 104 is a green sub-pixel. In other embodiments, the pixel group may also adopt other colors of pixel units. Certainly, in other embodiments, an arrangement mode of a plurality of sub-pixels P0 in the display panel is also not limited to those shown in FIG. 2 and FIG. 3. The embodiments of the present disclosure do not make any limit thereto.

For example, as shown in FIG. 2, in the second display region 20, all the pixel units P0 are uniformly and regularly arranged, which is not repeated herein.

For example, as shown in FIG. 3, a display substrate further includes a gate line 113 and a data line 313. The gate line 113 and the data line 313 are insulated from each other. Each gate line 113 is connected with one row of sub-pixels, and each data line 313 is connected with one column of sub-pixels. For example, the gate line 113 is configured to provide a scanning signal to one row of sub-pixels. The data line 313 is configured to provide a data signal to one column of sub-pixels.

For example, as shown in FIG. 3, the data line 313 includes a first data line DL1. The first data line DL1 is at least located in a first display region 10. For example, the first data line DL1 extends to a second display region 20 from the first display region 10. For example, as shown in FIG. 3, the gate line 113 includes a first gate line GL1 and the first gate line GL1 extends to the first display region 10 from the second display region 20.

Figure 4:
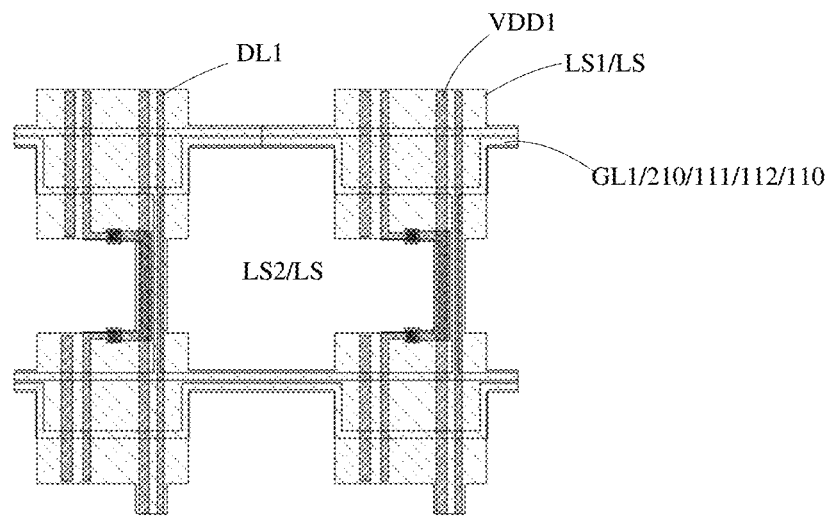
FIG. 4 is a schematic diagram of a display substrate provided by at least one embodiment of the present disclosure.

For clarity and brevity, FIG. 3 merely schematically shows a connection relationship between adjacent pixel groups P1 in the first display region 10 and does not constitute limitation to the present disclosure. FIG. 4 is a schematic diagram of a display substrate provided by at least one embodiment of the present disclosure. For example, as shown in FIG. 4, the display substrate further includes a first power line VDD1, and the first power line VDD1 is configured to be connected with a plurality of pixel unit groups P1 to provide a first power voltage to the plurality of pixel unit groups P1.

For example, as shown in FIG. 4, the display substrate further includes a shielding layer LS, and the shielding layer LS is disposed on a base substrate 100, is located on a side of the first power line VDD1 close to the base substrate 100, and includes a hollow region LS2 and a shielding region LS1. For example, the hollow region LS2 corresponds to a light-transmitting region R0 between the adjacent first pixel unit groups shown in FIG. 3. As shown in FIG. 3 and FIG. 4, the light-transmitting region R0 is formed in a surrounding mode by two adjacent first gate lines GL1 and two adjacent first data lines DL1, but is not limited thereto.

For example, the first display region 10 includes a plurality of light-transmitting regions R0; and the light-transmitting region R0 is located between the adjacent first pixel groups P1. The light-transmitting region R0 can transmit ambient light. For example, the light-transmitting region R0 may include a base substrate and a transparent insulating layer located on the base substrate, and the light-transmitting region R0 is not provided with a light shielding structure and for example, is not provided with a metal wire. For example, the light-transmitting region R0 is located in a region surrounded by four adjacent pixel unit groups P1 and wires connecting the pixel unit groups P1, but is not limited thereto.

For example, as shown in FIG. 4, the adjacent pixel unit groups are connected through the wires (e.g., the first data line DL1, a first power line 311, the gate line GL1, a first reset signal line 111, a second reset signal line 112, a light-emitting control signal line 110, and an initialization signal line 210), and for example, orthogonal projections of the plurality of pixel unit groups P0 and the wires on the base substrate 100 fall within an orthogonal projection of the shielding region LS1 of the shielding layer LS on the base substrate 100. Namely, the shielding region LS1 shields numerous slits existing between the wires connecting a plurality of first pixel unit groups and between the internal connections of each first pixel unit group, so as to avoid diffraction and interference generated when light pass through these slits, and the glare phenomenon generated due to uneven brightness when the light reaches a camera.

Figure 6A:
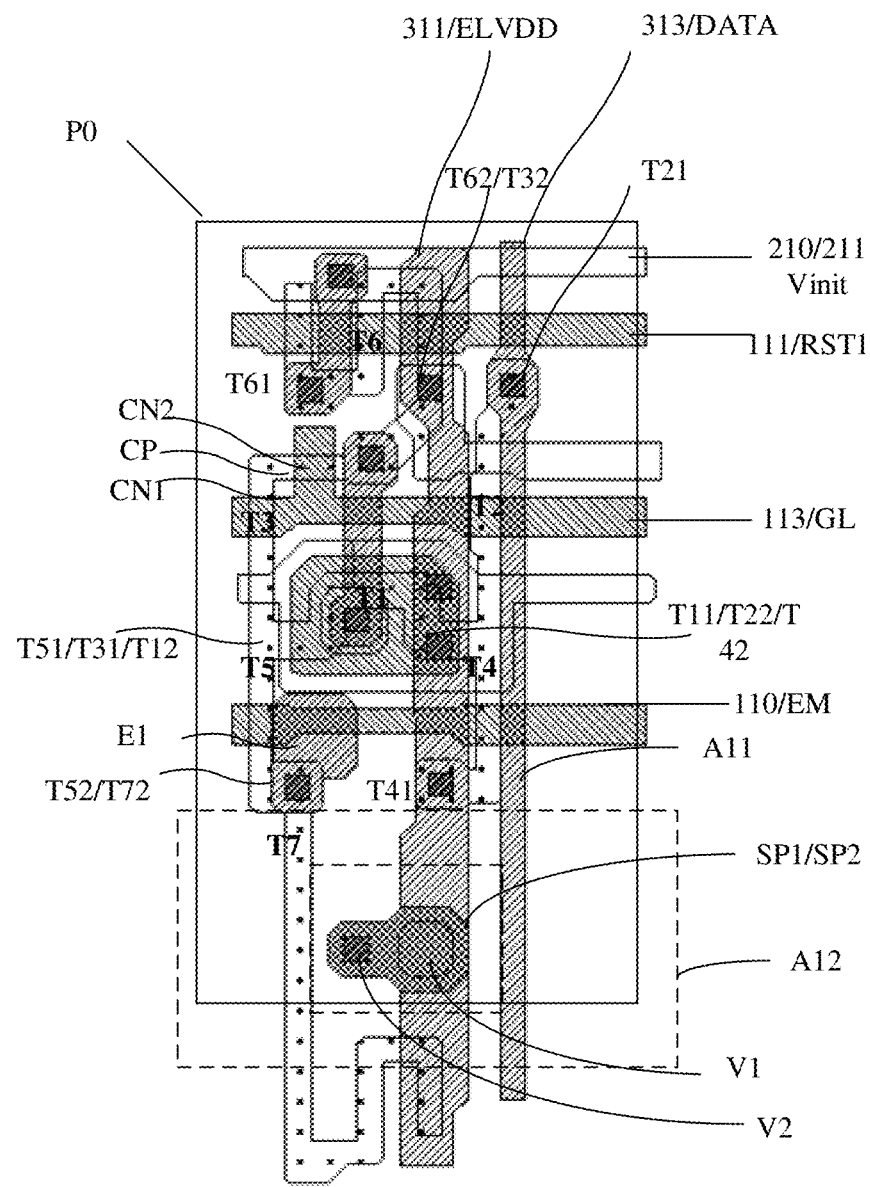
FIG. 6A is a schematic diagram of a laminated structure of the pixel driving circuit shown in FIG. 5.
Figure 6B:
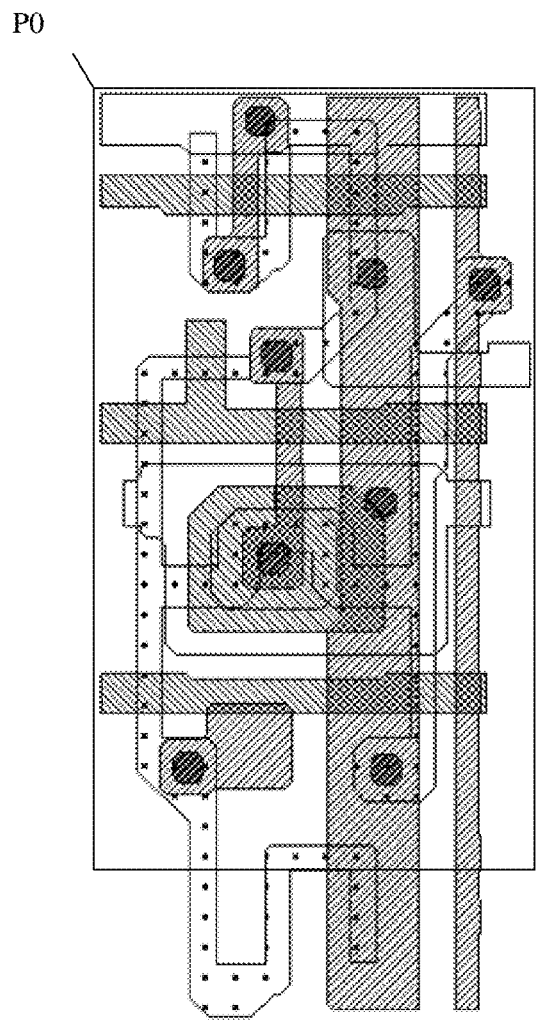
FIG. 6B is a schematic diagram of another laminated structure of the pixel driving circuit shown in FIG. 5.

For example, in the embodiments of the present disclosure, as shown in FIG. 6A, each of a plurality of first pixel units P0 includes a pixel region A11 (i.e., a region of a transistor, a capacitor, and the wire in the first pixel unit) and for example, the plurality of power lines 311 (for example, for the first pixel unit P0, the power line 311 is the first power line VDD1; for a second pixel unit C, the power line 311 is a second power line VDD2; and the embodiments below are the same and will not be repeated) are located in the pixel region A11 and an opening region A12. For example, the opening region is a region obtained after the first pixel unit P0 shown in FIG. 6B is downsized. For example, the first pixel unit P0 vacates one opening region A12 (as shown in FIG. 6A) in the same solid line rectangular box by properly reducing the wire width of the wire of a pixel driving circuit, the width-to-length ratio of each transistor, the size of the capacitor, and the size of a connecting hole as shown in FIG. 6B, placing the wires in a centralized mode, and the like, so that the light transmittance of the display panel can be improved. For example, in the embodiments of the present disclosure, the pixel regions A11 are placed in a centralized mode at a position above the pixel unit group P0 (i.e., the solid line rectangular box) so as to reduce the space occupied by the driving circuit and meanwhile, keep the pixel resolution unchanged, and thus, a partial space (i.e., the opening region A12) can be vacated for placing a first shielding connecting portion SP1 and a connecting hole V1/V2 which connect the shielding layer LS to the first power line 311; and specific contrast diagrams of the normal pixel unit and the downsized pixel unit are as shown in FIG. 6B and FIG. 6A.

For example, the size of the pixel driving circuit in FIG. 6A (i.e., the size of the downsized pixel driving circuit after the size is reduced) is one quarter of the size of the pixel driving circuit shown in FIG. 6B (i.e., the size of the pixel driving circuit before the size is reduced), and certainly, may also be one-sixth, half of the size of the pixel driving circuit shown in FIG. 6B; as long as the corresponding functions can be achieved, the embodiments of the present disclosure do not make any limit thereto. For example, in some examples, for a Full High Definition (FHD) resolution under-panel camera screen, the size of the pixel driving circuit may be compressed to the Quarter High Definition (QHD) level, and meanwhile, the FHD level pixel resolution is kept unchanged, and thus, some spaces can be vacated for placing the shielding connecting portion LS2 and the connecting hole which connect the shielding layer LS.

In the embodiments of the present disclosure, by reducing the size of the pixel driving circuit of the first pixel unit, it is beneficial to transmission of the light and meanwhile, is beneficial for implementing connection of the shielding layer and the first power line or other power lines on the premise of not changing the pixel resolution, so that on the premise of not reducing the PPI, a direct-current signal can be connected to the shielding layer, to prevent signal reference caused to the pixel driving circuit by a case that the shielding layer is in a floating state, reduce the voltage drop of the first power line, and improve the display quality of the display panel.

In order to ensure etching uniformity of the shielding layer, there may also be the shielding layer below a pixel circuit of a normal display region. For example, an orthogonal projection of the second display region 20 on the base substrate 100 falls within the orthogonal projection of the shielding region LS2 of the shielding layer LS on the base substrate 100. For example, the second display region 20 does not include the light-transmitting region R0, and thus, a portion of the shielding layer LS, which corresponds to the second display region 20, may be a whole surface, i.e., has no hollow region, so that a gap in each pixel driving circuit in the second display region 20 and a gap generated between the wires connecting the pixel driving circuits in the second display region 20 can be shielded.

Wires of a normal pixel driving circuit (e.g., the pixel driving circuit shown in FIG. 6B) are relatively compact, the size occupied by the wires of the driving circuit is the size of the PPI, and thus, there is no residual space for disposing the shielding connecting portion and the connecting hole which connect the shielding layer LS.

For this, in order to ensure that the PPI are unchanged, the pixel driving circuit in the second display region 20 adopts the same structure with the pixel driving circuit in the first display region 10, i.e., also adopts the structure and the size shown in FIG. 6A.

For example, for the second display region 20, as shown in FIG. 1B and FIG. 1C, the second display region 20 includes a plurality of second pixel units C arranged in an array and a plurality of second power lines VDD2, and the structure of each of the plurality of second pixel units C is as shown in FIG. 6A, and for example, includes a pixel region A11 and an opening region A12.

For example, the plurality of second power lines VDD2 are configured to be connected with the plurality of second pixel units C so as to provide a second power voltage to the plurality of second pixel units C. For example, the second power voltage and the first power voltage are the same. For example, the second power lines VDD2 extend along a second direction X1, and one second power line VDD2 provides the second power voltage to one column of second pixel units C.

It should be noted that in order to distinguish different regions where the power lines 311 are located, the power line 311 located in the first display region 10 is called as the first power line VDD1, the power line 311 located in the second display region 20 is called as the second power line VDD2, and both of them provide the same signals, i.e., the first power voltage and the second power voltage are the same and have no essential difference.

For example, for one second pixel unit C, the opening region A12 of each second pixel unit C at least partially overlaps with the shielding region LS1 of the shielding layer LS, i.e., after adopting the downsized pixel structure shown in FIG. 6A after the size is reduced, the second pixel unit C also vacate the opening region to facilitate connection of the shielding layer LS and the second power line VDD2 so as to provide the direct-current signal to the shielding layer LS and avoid floating connection of the shielding layer LS.

For example, the opening region A12 of at least one second pixel unit C includes a second shielding connecting portion SP2, the second shielding connecting portion SP2 at least partially overlaps with the shielding region LS2 of the shielding layer LS, and the shielding layer LS is connected with at least one of the plurality of second power lines VDD2 through the second shielding connecting portion SP2 to receive the second power voltage so as to provide the direct-current signal to the shielding layer LS and avoid floating connection of the shielding layer LS.

Figure 7:
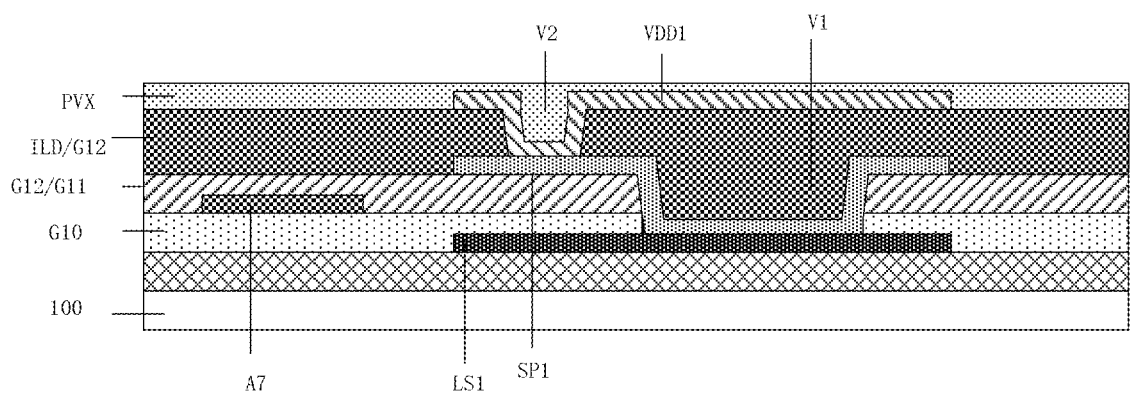
FIG. 7 is a schematic cross-sectional diagram along a line A-A' provided by at least one embodiment of the present disclosure.

FIG. 7 is a schematic cross-sectional diagram along a line A-A' provided by at least one embodiment of the present disclosure. Illustration is given below by taking the first pixel unit P0 as an example, and the embodiments of the present disclosure do not make any limit thereto.

For example, as shown in FIG. 6A and FIG. 7, the shielding layer LS (e.g., the shielding region LS1 thereof) is connected with the first shielding connecting portion SP1 through a first through hole V1, and the first shielding connecting portion SP1 is connected with at least one first power line VDD1 through a second through hole V2.

For example, as shown in FIG. 7, the display substrate further includes a first insulating layer G11, a second insulating layer G12, a third insulating layer ILD, and a fourth insulating layer G10. For example, the first insulating layer G11 is located between the shielding layer LS (e.g., the shielding region LS1 thereof) and the first shielding connecting portion SP1.

For example, as shown in FIG. 7, the second insulating layer G12 is located between the first insulating layer G11 and the first shielding connecting portion SP1, and the third insulating layer ILD is located between the first shielding connecting portion SP1 and a plurality of first power lines VDD1; or, the second insulating layer G12 is located between the first shielding connecting portion SP1 and a plurality of first power lines VDD1, and the third insulating layer ILD is located between the second insulating layer G12 and a plurality of first power lines VDD1. A positional relationship of the second insulating layer G12 is not specifically shown in FIG. 7 and may be determined according to the actual condition, which is not limited in the embodiments of the present disclosure.

For example, in some examples, the shielding layer LS is connected with the first shielding connecting portion SP1 by the first through hole passing through the first insulating layer G11, and the first shielding connecting portion SP1 is connected with at least one first power line VDD1 by the second through holes passing through the second insulating layer G12 and the third insulating layer ILD; or, for example, in some other examples, as shown in FIG. 7, the shielding layer LS is connected with the first shielding connecting portion SP1 by the first through holes V1 passing through the first insulating layer G11 and the second insulating layer G12, and the first shielding connecting portion SP1 is connected with the at least one first power line VDD1 by the second through hole passing through the third insulating layer ILD. Namely, the first shielding connecting portion SP1 may be located in a first conductive layer, or may be located in a second conductive layer. FIG. 7 shows a schematic diagram in which the first shielding connecting portion SP1 is located in the second conductive layer, and the embodiments of the present disclosure do not make any limit thereto. Related explanation on the first conductive layer and the second conductive layer will be described below and is not repeated herein. For example, explanation is given below by taking a case that the first shielding connecting portion is located in the first conductive layer as an example, and the embodiments of the present disclosure do not make any limit thereto.

Figure 8:
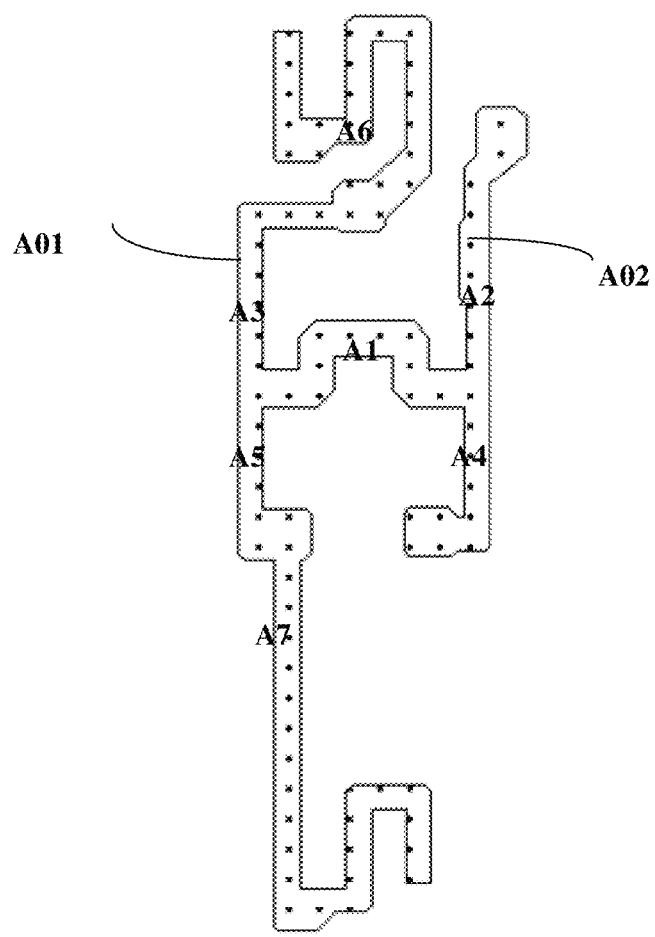
FIG. 8 is a plan view of a semiconductor pattern of a display substrate shown in FIG. 6A.
Figure 9:
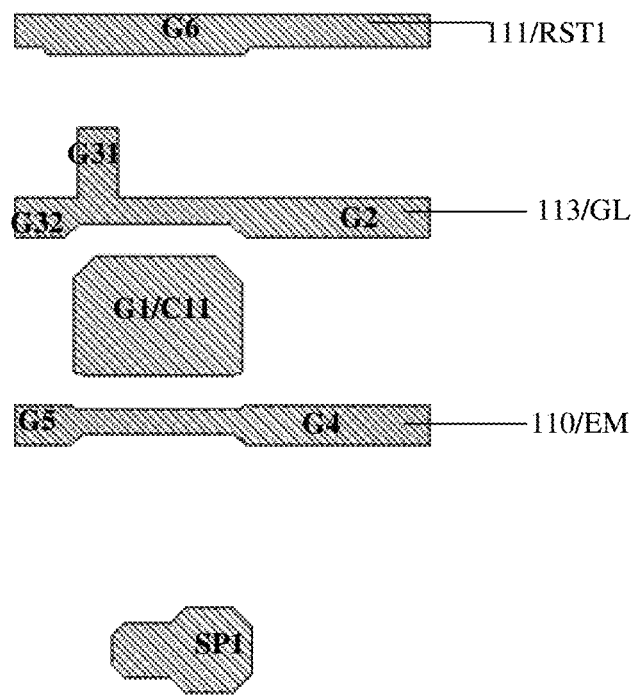
FIG. 9 is a plan view of a first conductive layer of the display substrate shown in FIG. 6A.
Figure 10:
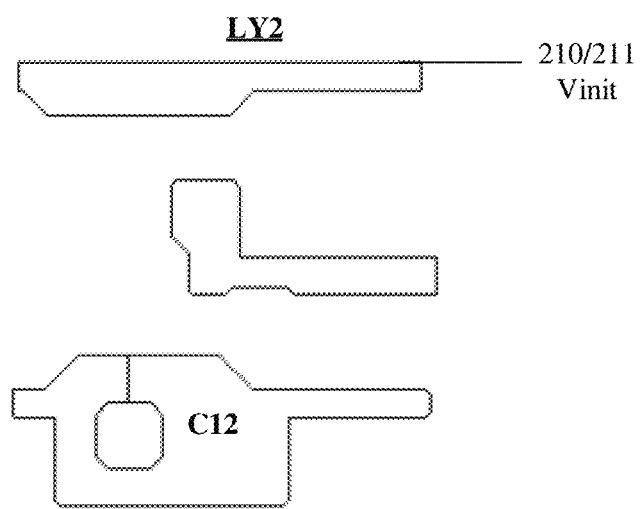
FIG. 10 is a plan view of a second conductive layer of the display substrate shown in FIG. 6A.
Figure 11:
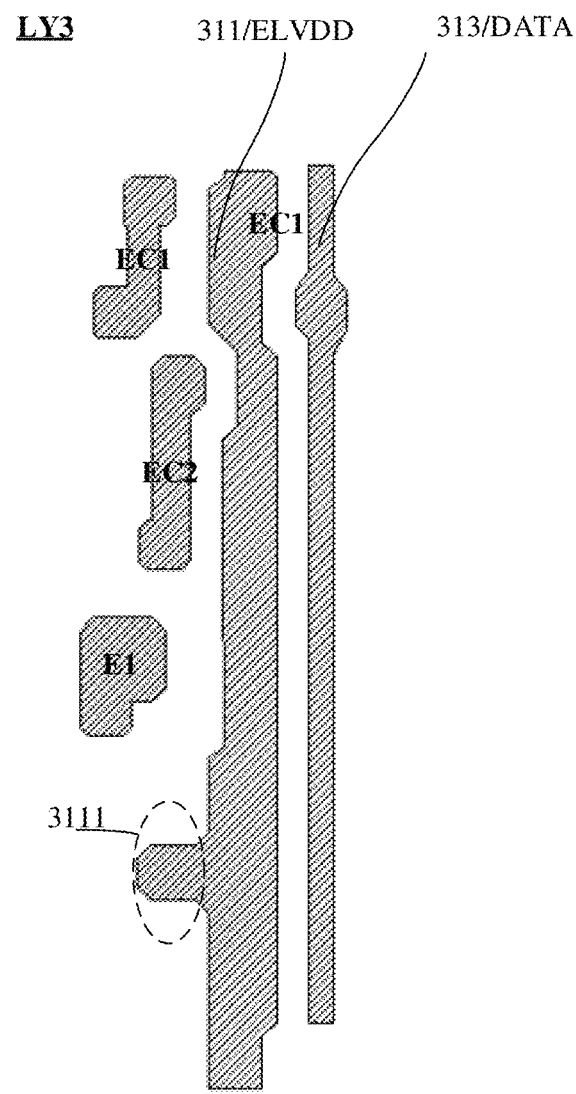
FIG. 11 is a plan view of a third conductive layer of the display substrate shown in FIG. 6A.

FIG. 8 is a plan view of a semiconductor pattern of the display substrate shown in FIG. 6A; FIG. 9 is a plan view of the first conductive layer of the display substrate shown in FIG. 6A; FIG. 10 is a plan view of the second conductive layer of the display substrate shown in FIG. 6A; and FIG. 11 is a plan view of a third conductive layer of the display substrate shown in FIG. 6A.

As shown in FIG. 7, the fourth insulating layer G10 is located between the shielding layer LS and an active layer of a transistor (e.g., an active layer A7 of a second reset transistor T1).

For example, as shown in FIG. 8 to FIG. 11, the first conductive layer LY1 includes a gate line GL1, the second conductive layer LY2 includes a second polar plate C12 of a storage capacitor C1, and the third conductive layer LY3 includes the first power line VDD1. For example, in a direction perpendicular to the base substrate 100, the first insulating layer G11 is located between the active layer A7 and the first conductive layer LY1, the second insulating layer G12 is located between the gate line and the second conductive layer LY2, and the third insulating layer ILD is located between the second polar plate C12 of the storage capacitor C1 and the third conductive layer LY3. For example, the first shielding connecting portion SP1 is located in the first conductive layer LY1 shown in FIG. 9, and the embodiments of the present disclosure do not make any limit thereto.

Figure 5:
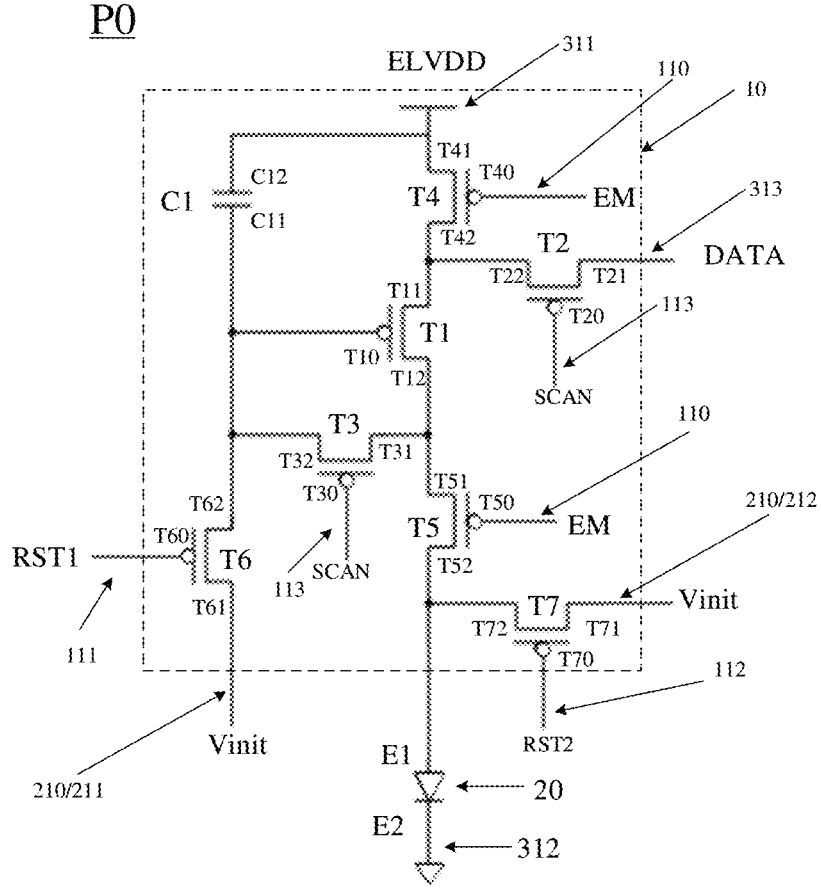
FIG. 5 is a schematic diagram of a pixel driving circuit provided by at least one embodiment of the present disclosure.

For example, as shown in FIG. 5, the pixel driving circuit includes a driving transistor T1, a data writing transistor T2, a compensation transistor T3, a first light-emitting control transistor T4, a second light-emitting control transistor T5, a first reset transistor T6, a second reset transistor T7, and a storage capacitor C1. For example, each transistor and the capacitor respectively include a first electrode and a second electrode, and illustration on a connection relationship and a working principle of the pixel driving circuit may refer to description in the art and is not repeated herein.

For example, as shown in FIG. 8, active layers A6, A3, A5 and A7 of the first reset transistor T6, the compensation transistor T3, the second light-emitting control transistor T5, and the second reset transistor T7 are located in a first semiconductor layer A01 extending along a first direction Y1; active layers A2 and A4 of the data writing transistor T2 and the first light-emitting control transistor T4 are located in a second semiconductor layer A02 extending along a second direction X1, the first semiconductor layer A01 and the second semiconductor layer A02 are connected through an active layer A1 of the driving transistor T1 and integrally formed.

For example, as shown in FIG. 6A and FIG. 8, the active layer A1 of the driving transistor T1 is located in an imaginary line of the active layer A6 of the first reset transistor T6 in the first direction Y1; the active layers A3 and A2 of the compensation transistor T3 and the data writing transistor T2 are respectively located on both sides of the active layer A1 of the driving transistor T1 and located on a side of the active layer A1 of the driving transistor T1, which is close to the active layer A6 of the first reset transistor T6, i.e., in the second direction Y1, the active layers A3 and A2 of the compensation transistor T3 and the data writing transistor T2 are located above the active layer A1 of the driving transistor T1; and the active layers A5 and A4 of the second light-emitting control transistor T5 and the first light-emitting control transistor T4 are respectively located on both sides of the active layer A1 of the driving transistor T1, located on a side of the active layer A1 of the driving transistor T1 away from the active layer A6 of the first reset transistor T6, and for example, in the second direction Y1, located below the active layer A1 of the driving transistor T1.

For example, as shown in FIG. 6A and FIG. 9, the active layer A7 of the second reset transistor T7 is located on a side of the active layer A5 of the second light-emitting control transistor T5, which is away from the active layer of the compensation transistor T3, the compensation transistor T3 includes a first gate electrode G31 extending along the first direction Y1 and a second gate electrode G32 extending along the second direction X1, and in the first direction Y1, the second gate electrode G32 is arranged side by side with a gate electrode G5 of the second light-emitting control transistor T5 and a gate electrode (not shown) of the second reset transistor T7, which extend along the second direction X2; and a gate electrode G2 of the data writing transistor T2 and a gate electrode G4 of the first light-emitting control transistor T4 extend along the second direction X1 and are arranged side by side in the first direction Y1.

For example, a gate electrode G6 of the first reset transistor T6 and a gate electrode G1 of the driving transistor T1 extend along the second direction X1 and are arranged side by side in the first direction Y1, and the gate electrode G1 of the driving transistor T1 and a first polar plate C11 of the storage capacitor C1 are integrally formed.

For example, the display substrate further includes a gate line 113, a light-emitting control signal line 110, a first reset signal line 111, and a second reset signal line (integrally formed with the gate electrode of the second reset transistor T7) which extend along the second direction Y1.

For example, the gate electrode G6 of the first reset transistor T6 and the first reset signal line 111 are connected and integrally formed, the second gate electrode G32 of the compensation transistor T3 and the gate electrode G2 of the data writing transistor T2 are connected with the gate line 113 and are integrally formed with the gate line 113, the gate electrode G6 of the second light-emitting control transistor T6 and the gate electrode G5 of the first light-emitting control transistor T5 are connected with the light-emitting control signal line 110 and are integrally formed with the light-emitting control signal line 110, and the gate electrode of the second reset transistor T7 and the second reset signal line are connected and integrally formed.

For example, the display substrate further includes the gate line 113, the light-emitting control signal line 110, the first reset signal line 111, and the second reset signal line 112 which extend along the second direction Y1; for example, the gate electrode of the first reset transistor T6 and the first reset signal line 111 are connected and integrally formed; and the second gate electrode G32 of the compensation transistor T3 and the gate electrode G2 of the data writing transistor T2 are connected with the gate line 113 and are integrally formed with the gate line 113. The gate electrode G5 of the second light-emitting control transistor T5 and the gate electrode G4 of the first light-emitting control transistor T4 are connected with the light-emitting control signal line 110 and are integrally formed, and the gate electrode G7 of the second reset transistor T7 and the second reset signal line 112 are connected and are integrally formed.

For example, the display substrate further includes a data line 313, the data line 313 is connected with the active layer A4 of the data writing transistor T4 and configured to provide a data signal DATA, the orthogonal projection of the first power line VDD1 on the base substrate 100 at least partially overlaps with orthogonal projections of the active layer A6 of the first reset transistor T6 and the active layer A1 of the driving transistor T1 on the base substrate 100, and an orthogonal projection of the data line 313 on the base substrate 100 is located on a side of an orthogonal projection of the second semiconductor layer A02 on the base substrate 100, which is away from the orthogonal projection of the first power line VDD1 on the base substrate 100.

For example, as shown in FIG. 6A and FIG. 11, the pixel driving circuit further includes a first transfer electrode EC1, the first transfer electrode EC1 is connected with the active layer of the second light-emitting control transistor T5, the active layer A7 of the second reset transistor T7, and a first electrode E1 of a light-emitting member 20 through a through hole, and an orthogonal projection of the first transfer electrode EC1 on the base substrate 100 is located between orthogonal projections of the active layer A7 of the second reset transistor T7 and the active layer A1 of the driving transistor T1 on the base substrate 100.

For example, for each of the plurality of second pixel units C, an orthogonal projection of the second shielding connecting portion SP2 on the base substrate 100 is located between the orthogonal projection of the active layer A7 of the second reset transistor T7 on the base substrate 100 and an orthogonal projection of the second power line VDD2 on the base substrate 100 and at least partially overlaps with the orthogonal projection of the second power line VDD2 on the base substrate 100, and thus, the opening region A12 can be vacated.

For example, with reference to FIG. 5, the gate line 113 is configured to provide a scanning signal SCAN to a pixel circuit 10. The light-emitting control signal line 110 is configured to provide a light-emitting control signal EM to a sub-pixel P0. The data line 313 is configured to provide a data signal DATA to the pixel circuit 10, the first power line 311 is configured to provide a constant first voltage signal ELVDD to the pixel circuit 10, a third power line 312 is configured to provide a constant second voltage signal ELVSS to the pixel circuit 10, and the first voltage signal ELVDD is greater than the second voltage signal ELVSS.

The initialization signal line 210 is configured to provide an initialization signal Vinit to the pixel circuit 10. The initialization signal Vinit is a constant voltage signal, the magnitude of the initialization signal Vinit, for example, may be between the first voltage signal ELVDD and the second voltage signal ELVSS, but the present disclosure is not limited thereto, and for example, the initialization signal Vinit may be less than or equal to the second voltage signal ELVSS. For example, the pixel circuit outputs a driving current under the control of signals such as the scanning signal SCAN, the data signal DATA, the initialization signal Vinit, the first voltage signal ELVDD, the second voltage signal ELVSS, the light-emitting control signal EM, and the like so as to drive a light-emitting element 20 to emit light. The light-emitting element 20 emits red light, green light, blue light, or white light, and the like under the drive of the corresponding pixel circuit 10.

As shown in FIG. 5, the driving transistor T1 of the pixel circuit 10 is electrically connected with the light-emitting element 20, and outputs the driving current under the control of signals such as the scanning signal SCAN, the data signal DATA, the first voltage signal ELVDD, the second voltage signal ELVSS, and the like so as to drive the light-emitting element 20 to emit light.

For example, a display panel provided by an embodiment of the present disclosure further includes: a data driving circuit and a scanning driving circuit. The data driving circuit is configured to provide the data signal DATA to the sub-pixel P0 according to an instruction of a control circuit; and the scanning driving circuit is configured to provide a signal such as the light-emitting control signal EM, the scanning signal SCAN, a first reset control signal RST1, a second reset signal RST2, and the like to the sub-pixel P0 according to an instruction of the control circuit. For example, the control circuit includes an external integrated circuit (IC), but the present disclosure is not limited thereto. For example, the scanning driving circuit is a Gate Driver On Array (GOA) structure mounted on the display panel, or is a driving chip structure bonding with the display panel. For example, different driving circuits also may be adopted to respectively provide the light-emitting control signal EM and the scanning signal SCAN. For example, the display panel further includes a power source (which is not shown in the drawings) for providing the above-mentioned voltage signal, the power source may be a voltage source or a current source as required, and the power source is configured to respectively provide the first voltage signal ELVDD, the second voltage signal ELVSS, the initialization signal Vinit, and the like to the sub-pixel P0 through the first power line 311, the third power line 312, and the initialization signal line 210.

As shown in FIG. 5, the second electrode C12 of the storage capacitor C1 is electrically connected with the first power line 311, and the first electrode C11 of the storage capacitor C1 is electrically connected with a second electrode T32 of a threshold compensation transistor T3. A gate electrode T20 of the data writing transistor T2 is electrically connected with the gate line 113, and a first electrode T21 and a second electrode T22 of the data writing transistor T2 are respectively and electrically connected with the data line 313 and a first electrode T11 of the driving transistor T1. A gate electrode T30 of the threshold compensation transistor T3 is electrically connected with the gate line 113, a first electrode T31 of the threshold compensation transistor T3 is electrically connected with a second electrode T12 of the driving transistor T1, and the second electrode T32 of the threshold compensation transistor T3 is electrically connected with the gate electrode T10 of the driving transistor T1

For example, as shown in FIG. 5, a gate electrode T40 of the first light-emitting control transistor T4 and a gate electrode T50 of the second light-emitting control transistor T5 are both connected with the light-emitting control signal line 110.

For example, as shown in FIG. 5, a first electrode T41 and a second electrode T42 of the first light-emitting control transistor T4 are respectively and electrically connected with the first power line 311 and the first electrode T11 of the driving transistor T1. A first electrode T51 and a second electrode T52 of the second light-emitting control transistor T5 are respectively and electrically connected with the second electrode T12 of the driving transistor T16 and a pixel electrode E1 (which may be an anode of an OLED) of the light-emitting element 20. A common electrode E2 (which may be a common electrode of the OLED, e.g., a cathode) of the light-emitting element 20 is electrically connected with the third power line 312.

For example, as shown in FIG. 5, a gate electrode T60 of the first reset transistor T6 is electrically connected with the first reset control signal line 111, a first electrode T61 of the first reset transistor T6 is electrically connected with the initialization signal line 210 (a first initialization signal line 211), and a second electrode T62 of the first reset transistor T6 is electrically connected with the gate electrode T10 of the driving transistor T1. A gate electrode T70 of the second reset transistor T7 is electrically connected with the second reset control signal line 112, a first electrode T71 of the second reset transistor T7 is electrically connected with the initialization signal line 210 (a second initialization signal line 212), and a second electrode T72 of the second reset transistor T7 is electrically connected with the pixel electrode E1 of the light-emitting element 20.

FIG. 8 shows the semiconductor pattern SCP, FIG. 9 shows the first conductive layer LY1, and the first insulating layer G11 is arranged between the first conductive layer LY1 and the semiconductor pattern SCP. The semiconductor pattern SCP is doped by taking the first conductive layer LY1 as a mask, so that the semiconductor characteristic is reserved in a region of the semiconductor pattern SCP which is not covered by the first conductive layer LY1, a channel of a thin film transistor is formed, a region of the semiconductor pattern SCP, which is covered by the first conductive layer LY1, is subjected to conductor treatment, and a source electrode or a drain electrode of the thin film transistor is formed. FIG. 6A shows the active layer formed after the semiconductor pattern SCP is partially subjected to conductor treatment.

As shown in FIG. 9, the first conductive layer LY1 includes the first reset control signal line 111, the second reset control signal line (which is not shown in the drawing), the light-emitting control signal line 110, the gate line 113, and the first electrode C11 of the storage capacitor C1.

FIG. 10 shows the second conducive layer LY2, and the second insulating layer G12 is arranged among the second conductive layer LY2 and the first conductive pattern layer LY1. The second conductive layer LY2 includes the initialization signal line 210 and the second electrode C12 of the storage capacitor C1. The second electrode C12 of the storage capacitor C1 has an opening. The interlayer insulating layer ILD is located between the second conductive layer LY2 and the third conductive layer LY3. What is related to the first gate insulating layer, the second gate insulating layer, the interlayer insulating layer, the first conductive layer LY1, the second conductive layer LY2, and the third conductive layer LY3 may refer to illustration in the art, and will not be repeated herein.

FIG. 11 shows the third conductive layer LY3, and the third conductive layer LY3 includes the first power line 311, the data line 313, a first connection electrode EC1, a second connection electrode EC2, and the first electrode E1 of the light-emitting element 20.

For example, as shown in FIG. 11, the first power line 311 includes a protruding portion 3111, and an orthogonal projection of the second through hole V2 on the base substrate overlaps with an orthogonal projection of the protruding portion 3111 on the base substrate, i.e., the first shielding connecting portion SP1 is connected with the protruding portion 3111 of the first power line 311 through the second through hole V2. An orthogonal projection of the first through hole V1 on the base substrate overlaps with an orthogonal projection of the first power line 311 on the base substrate. For example, as shown in FIG. 6A and FIG. 7, the first through hole V1 and the second through hole V2 are disposed left and right and certainly, also may be disposed up and down in the first direction Y1, and the embodiments of the present disclosure do not make any limit thereto.

For example, in the embodiments of the present disclosure, the orthogonal projections of the first through hole V1 and the second through hole V2 on the base substrate do not overlap, i.e., the first through hole V1 and the second through hole V2 are disposed up and down or left and right, so as to simplify the process, and avoid the problems of a film layer being liable to fracture, the process being difficult to implement and the first power line 311 with a relatively slope gradient, being uneven and the like caused by overlapping of the orthogonal projections of the first through hole V1 and the second through hole V2 on the base substrate.

It should be illustrated that the transistors adopted in some embodiments of the present disclosure all may be thin film transistors, or field effect transistors, or other switching members with the same characteristics. The source electrode and the drain electrode of the transistor adopted herein may be symmetric in structure, so the source electrode and the drain electrode of the transistor structurally have no difference. In an embodiment of the present disclosure, in order to distinguish two electrodes of the transistor except for the gate electrode, it is directly described that one electrode is the first electrode, and the other electrode is the second electrode, and thus, the first electrodes and the second electrodes of all or part of transistors in the embodiments of the present disclosure may be exchanged as required. For example, according to the embodiments of the present disclosure, the first electrode of the transistor may be the source electrode, while the second electrode may be the drain electrode; or, the first electrode of the transistor is the drain electrode, while the second electrode is the source electrode.

In addition, the transistors may be classified into N-type and P-type transistors according to the characteristics of the transistors. The embodiments of the present disclosure are illustrated by taking a case that all the transistors adopt the P-type transistors as an example. Based on the description and teaching of the present disclosure on this implementation mode, those ordinary skilled in the art, without any creative work, could easily think of a case that at least part of transistors in the pixel circuit according to the embodiments of the present disclosure adopt the N-type transistors, i.e., an N-type transistor or N-type transistor and P-type transistor combined implementation mode is adopted, and thus, these implementation modes also fall within the protection scope of the present disclosure.

FIG. 6A illustrates by taking a 7T1C pixel circuit as an example, and the embodiments of the present disclosure include, but are not limited to it. It should be noted that the embodiments of the present disclosure do not make any limit to the number of the thin film transistors and the number of the capacitors included in the pixel circuit. For example, in some additional embodiments, the pixel circuit of the display panel also may be of a structure including other numbers of transistors, such as a 7T2C structure, a 6T1C structure, a 6T2C structure, or a 9T3C structure, which is not limited in the embodiments of the present disclosure.

For example, the base substrate 100 in at least one embodiment of the present disclosure may be a glass plate, a quartz plate, a metal plate or a resin plate, and the like. For example, a material of the base substrate may include an organic material, and for example, the organic material may be a resin material, such as polyimide, polycarbonate, polyacrylate, polyetherimide, polyether sulfone, polyethylene terephthalate, polyethylene naphthalate, and the like; and for example, the base substrate 100 may be a flexible substrate or a non-flexible substrate, and the embodiments of the present disclosure do not make any limit thereto.

For example, materials of the first insulating layer G11, the second insulating layer G12, the third insulating layer ILD, and the fourth insulating layer BL may include an inorganic insulating material such as SiNx, SiOx, SiNxOy, and the like, an organic insulating material such as organic resin and the like, or other proper materials, and the embodiments of the present disclosure do not make any limit thereto.

For example, a material of the third conductive layer LY3 may include titanium, titanium alloy, aluminium, aluminium alloy, copper, copper alloy, or any other proper composite materials, and the embodiments of the present disclosure do not make any limit thereto. For example, materials of the shielding layer LS, the first conductive layer LY1, and the second conductive layer LY2 may be the same with that of the third conductive layer LY3, which is not repeated herein.

For example, a material of the semiconductor layer 310 may include an oxide semiconductor, an organic semiconductor, or amorphous silicon, polycrystalline silicon, and the like, for example, the oxide semiconductor includes a metal oxide semiconductor (e.g., indium gallium zinc oxide (IGZO)), the polycrystalline silicon includes low-temperature polycrystalline silicon or high-temperature polycrystalline silicon and the like, and the embodiments of the present disclosure do not make any limit thereto. It should be noted that the source electrode region and the drain electrode region above-mentioned may be regions adopted with n-type impurities or p-type impurities, and the embodiments of the present disclosure do not make any limit thereto.

Schematic diagrams of several examples of the first shielding connecting portion are shown below. For example, the first shielding connecting portions may be located between two rows of first pixel units of the first display region, or at both ends of two rows of first pixel units of the first display region, or at one end of two rows of first pixel units of the first display region, and the embodiments of the present disclosure do not make any limit thereto.

Figure 12A:
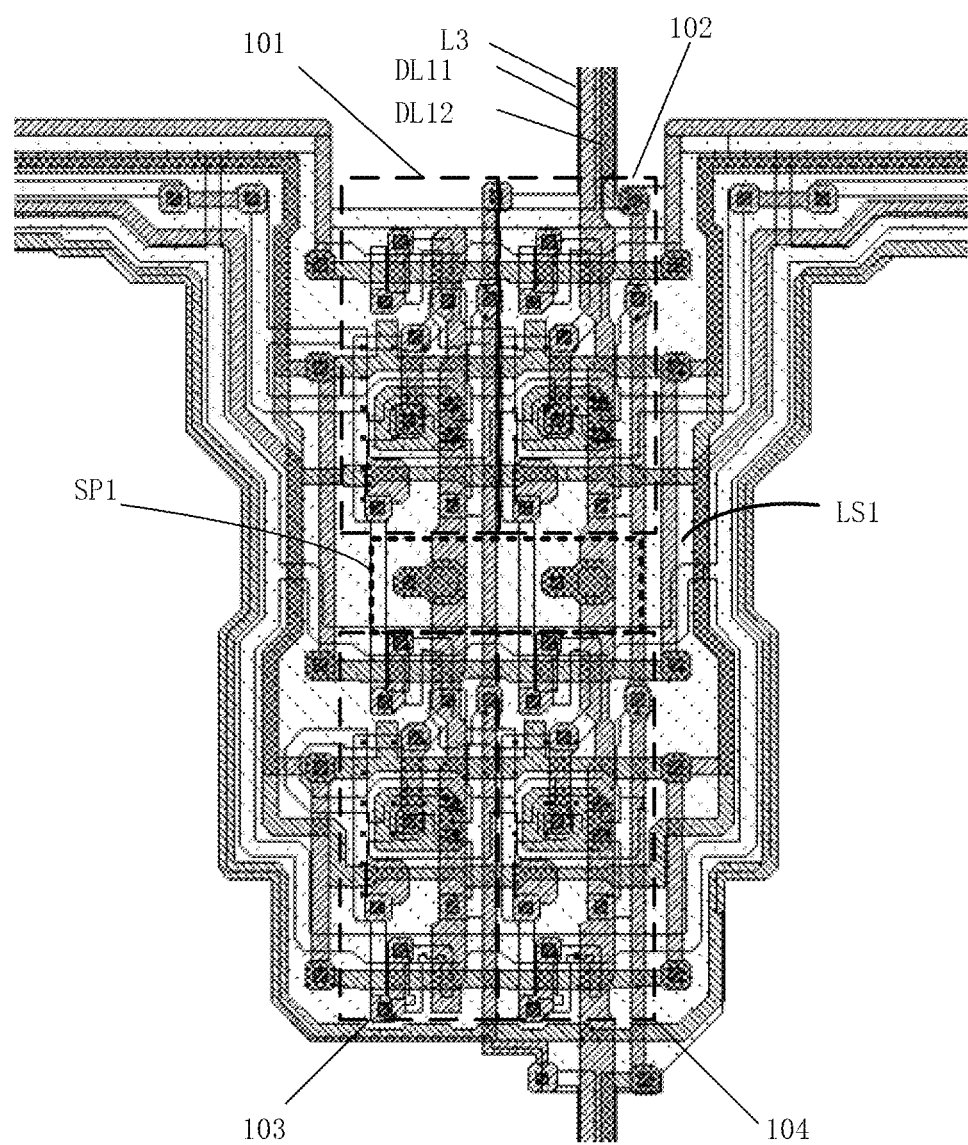
FIG. 12A is a schematic diagram of one example of a display substrate provided by at least one embodiment of the present disclosure.
Figure 12B:
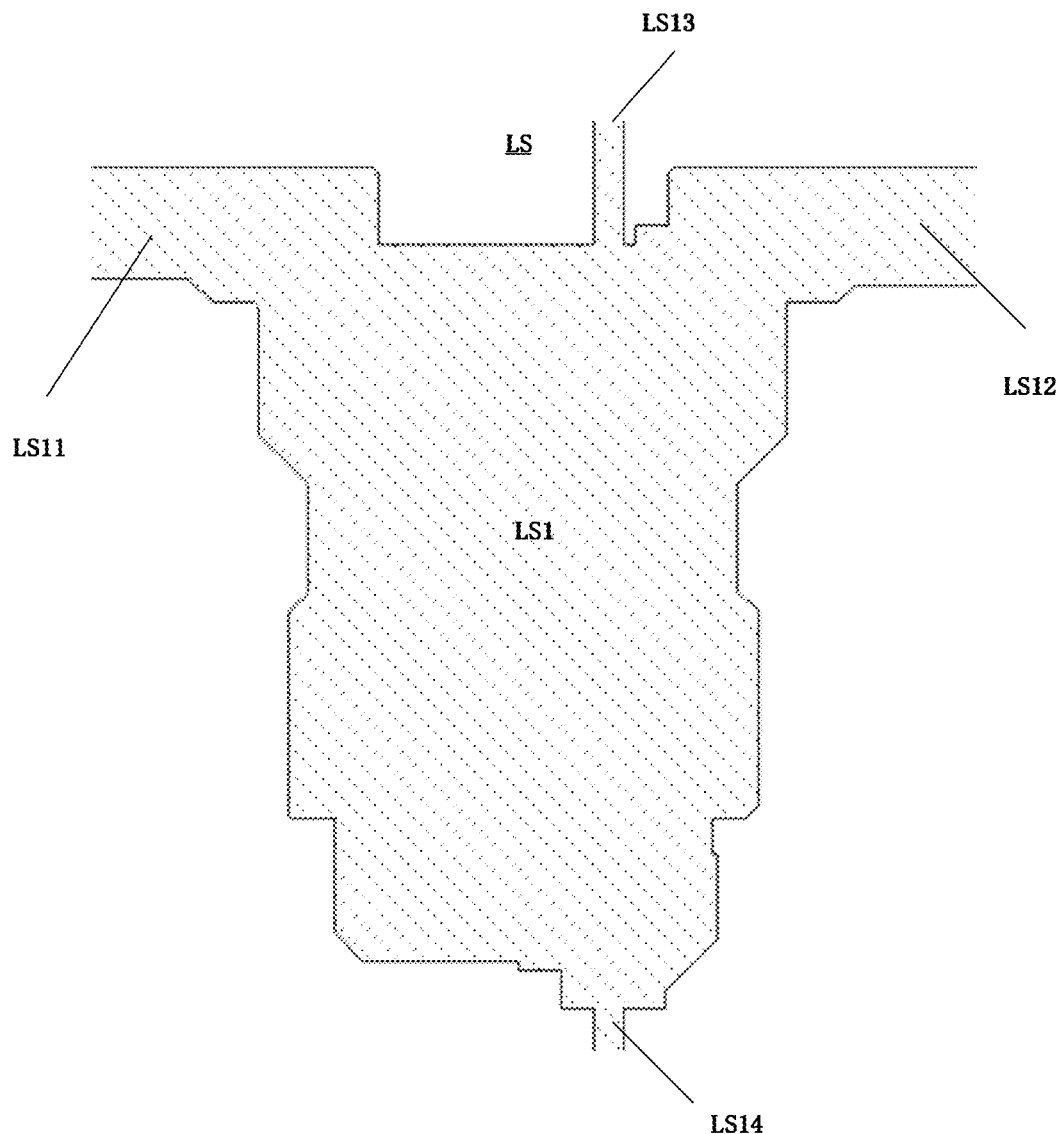
FIG. 12B is a plan view of a shielding region LS1 of a shielding layer LS of the display substrate shown in FIG. 12A.
Figure 12C:
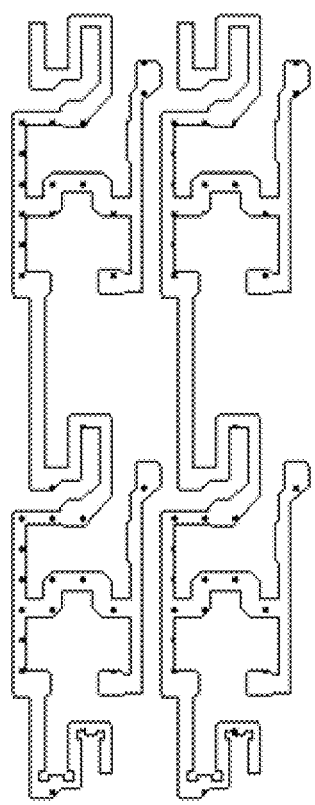
FIG. 12C is a plan view of a semiconductor pattern of the display substrate shown in FIG. 12A.
Figure 12D:
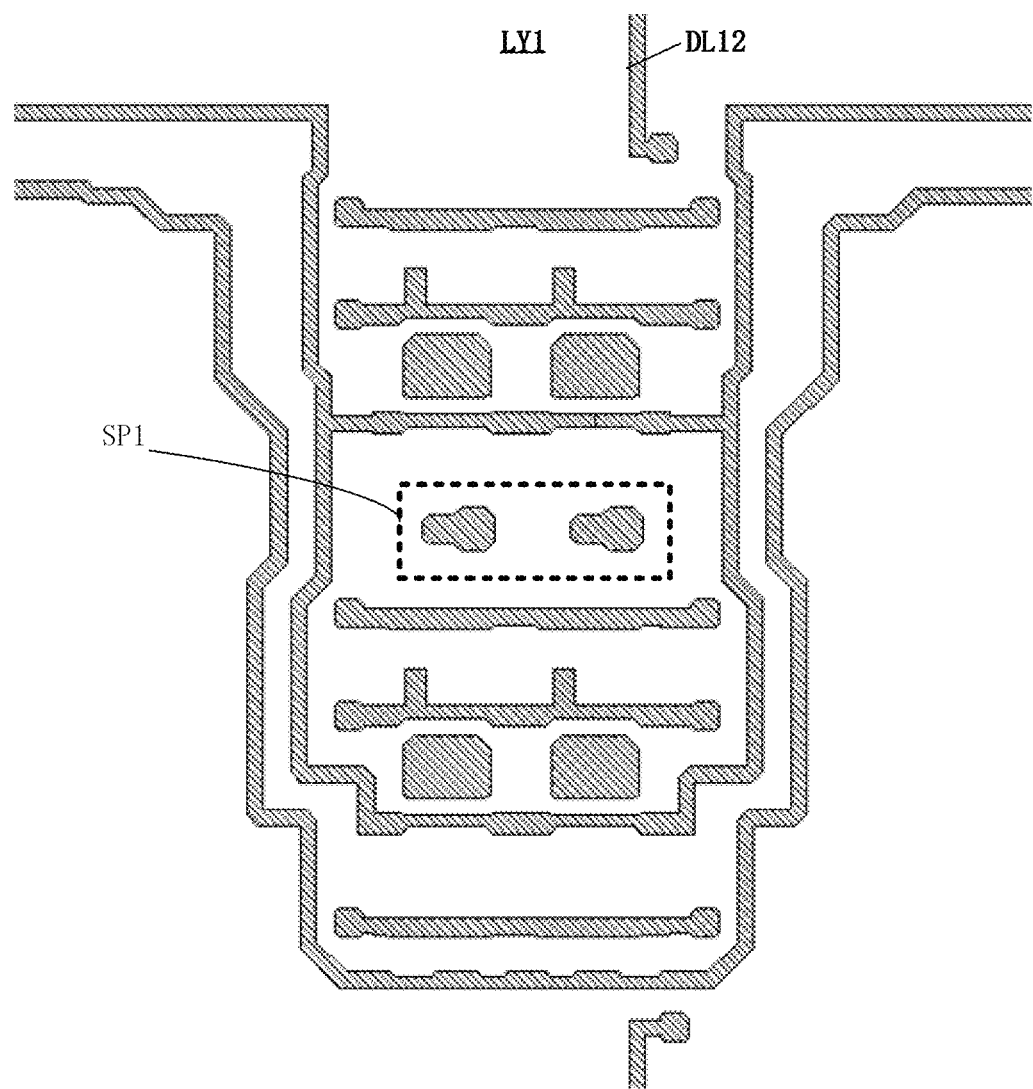
FIG. 12D is a plan view of a first conductive layer of the display substrate shown in FIG. 12A.
Figure 12E:
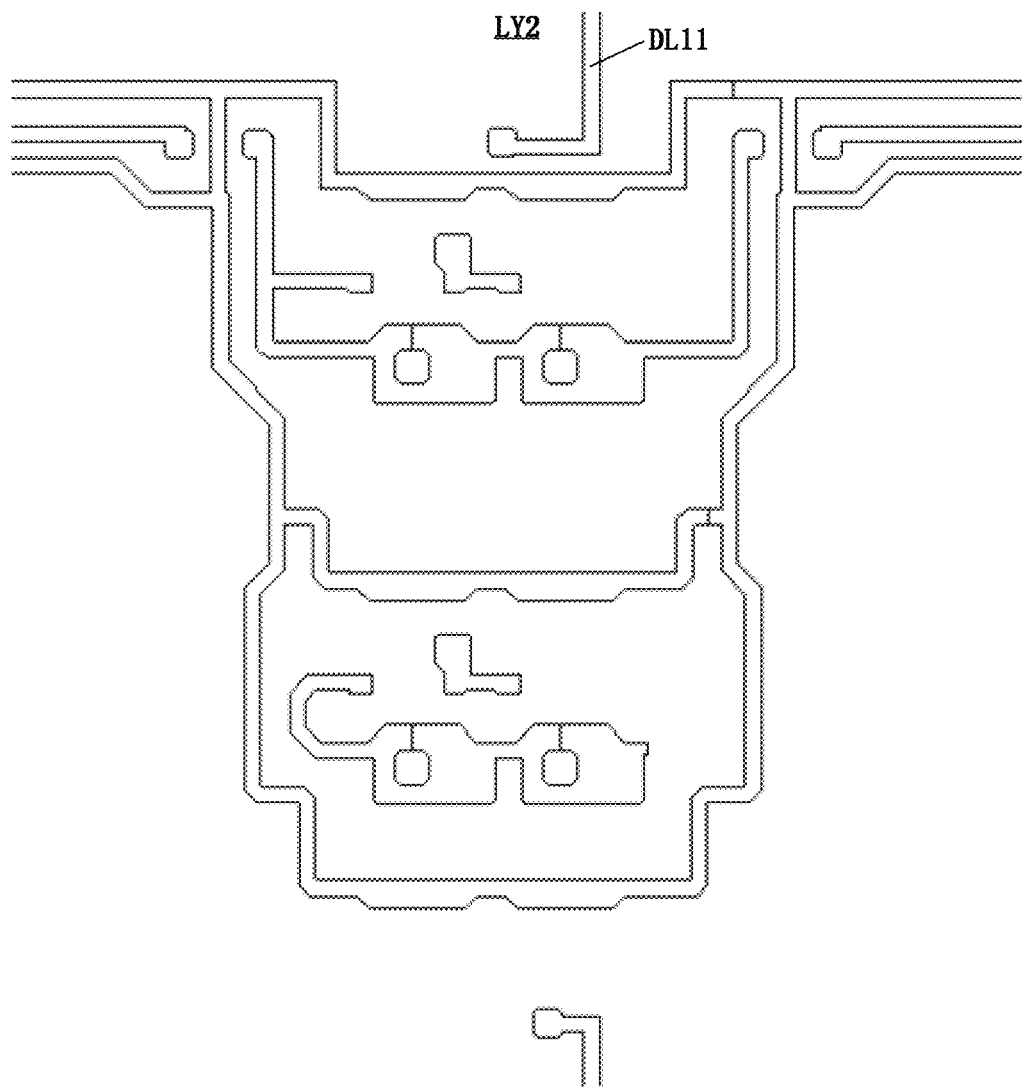
FIG. 12E is a plan view of a second conductive layer of the display substrate shown in FIG. 12A.
Figure 12F:
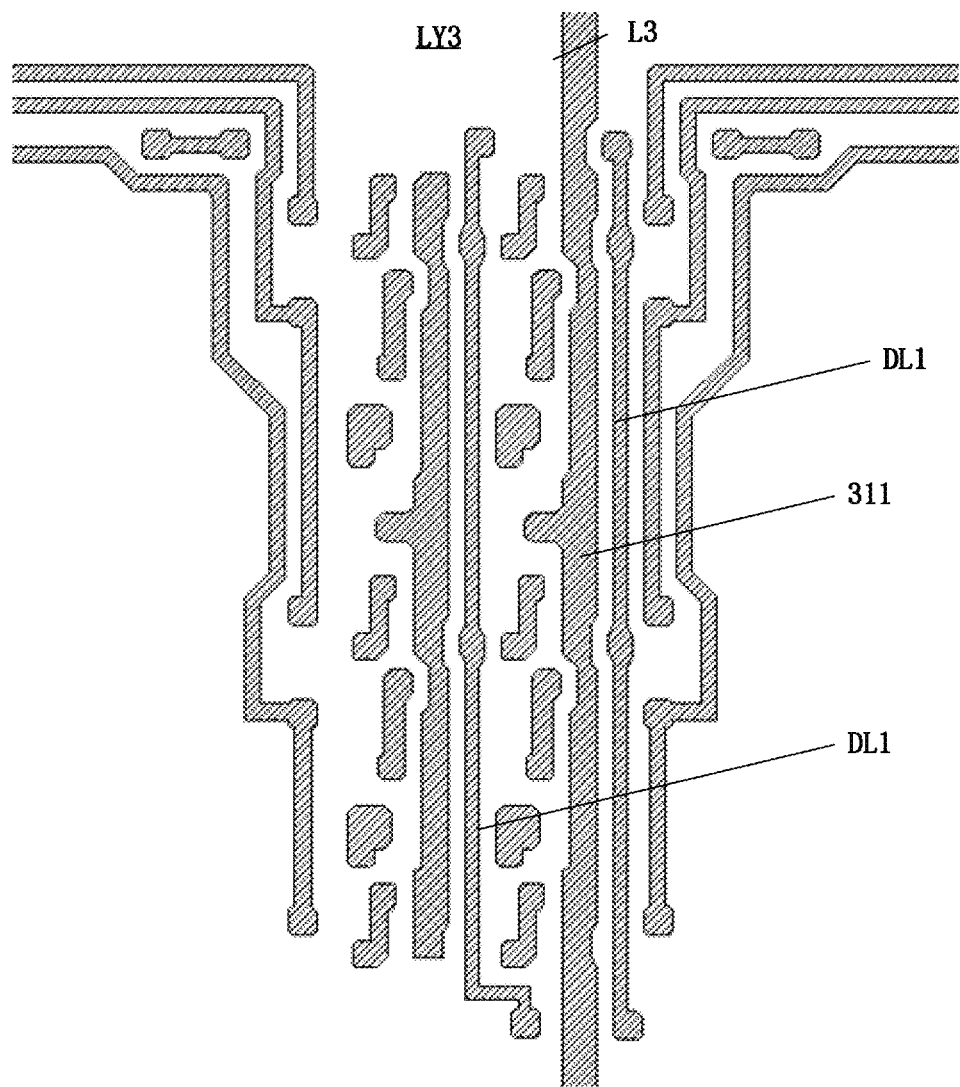
FIG. 12F is a plan view of a third conductive layer of the display substrate shown in FIG. 12A.

FIG. 12A is a schematic diagram of one example of the display substrate provided by at least one embodiment of the present disclosure; FIG. 12B is a plan view of the shielding region LS1 of the shielding layer LS of the display substrate shown in FIG. 12A; FIG. 12C is a plan view of the semiconductor pattern of the display substrate shown in FIG. 12A; FIG. 12D is a plan view of the first conductive layer of the display substrate shown in FIG. 12A; FIG. 12E is a plan view of the second conductive layer of the display substrate shown in FIG. 12A; and FIG. 12F is a plan view of the third conductive layer of the display substrate shown in FIG. 12A.

For example, as shown in FIG. 12A, one pixel unit group includes four first pixel units 101, 102, 103 and 104. For example, as shown in FIG. 12A, for each pixel unit group, the first shielding connecting portion SP1 is located between two adjacent first pixel units in the first direction Y1 in each pixel unit group. Illustration related to FIG. 12B to FIG. 12F may refer to description on FIG. 8 to FIG. 11.

For example, in the example shown in FIG. 12A, the orthogonal projection of the first shielding connecting portion SP1 on the base substrate 100 is located between the orthogonal projection of the active layer A7 of the second reset transistor T7 on the base substrate 100 and the orthogonal projection of the first power line VDD1 on the base substrate 100, and at least partially overlaps with the orthogonal projection of the first power line VDD1 on the base substrate 100 (for example, as shown in FIG. 6A).

For example, as shown in FIG. 12A, in the first direction Y1, the first power lines 311 between two adjacent pixel unit groups are connected through one third conductor L3, the first data line DL1 includes a first portion DL11 and a second portion DL12, the first portion DL11 of the first data line DL1 partially overlaps with the third conductor L3, the second portion DL12 of the first data line DL1 at least partially overlaps with the third conductor L3, and the first portion DL11 of the first data line DL1 and the second portion DL12 of the first data line DL1 are respectively located in different layers. For example, in FIG. 12A, the first portion DL11 of the first data line DL1 on the left side is located in the second conductive layer LY2 shown in FIG. 12E, and the second portion DL12 of the first data line DL1 on the right side is located in the first conductive layer LY1 shown in FIG. 12D. For example, with reference to FIG. 12A, FIG. 12D, and FIG. 12E, the first portion DL11 and the second portion DL12 of the first data line DL1 and the third conductor L3 are located between the adjacent pixel unit groups.

For example, as shown in FIG. 12F, the third conductor L3 and the first power line 311 are integrally formed, and the first power line 311 is connected with two adjacent pixel unit groups, which enables the adjacent pixel unit groups to be connected only through one third conductor, so that the wiring area is reduced and the light transmittance is improved.

For example, with reference to FIG. 12F, two first data lines DL1 are provided, and two first data lines DL1 are respectively connected with two adjacent columns of sub-pixels. For example, as shown in FIG. 12F, the first portion DL11 and the second portion DL12 are respectively connected with the two first data lines DL1, and partially overlap with an orthogonal projection of the same third conductor L3 on the base substrate BS. In such setting mode, the data line in two adjacent columns of sub-pixels, which is located between the pixel unit groups, can be hidden under the third conductor, so that the wiring area is reduced, and the light transmittance is improved.

For example, as shown in FIG. 12B, the shielding region LS1 includes a first portion LS11, a second portion LS12, a third portion LS13, and a fourth portion LS14 which respectively overlap with wires connected with the pixel unit group shown in FIG. 12A. For example, an orthogonal projection of the third portion LS13 of the shielding region LS1 on the base substrate overlaps with orthogonal projections of the third conductor L3 connected with a previous pixel unit group in FIG. 12A and the first portion DL11 and the second portion DL12 of the first data line DL1 on the base substrate, so that the third conductor L3, the first portion DL11 and the second portion DL12 of the first data line DL1, and gaps among them can be shielded. An orthogonal projection of the fourth portion LS14 of the shielding region LS1 on the base substrate overlaps with orthogonal projections of the third conductor L3 connected with a next pixel unit group in FIG. 12A and the first portion DL11 and the second portion DL12 of the first data line DL1 on the base substrate. Orthogonal projections of the first portion LS11 and the second portion LS12 of the shielding region LS1 on the base substrate respectively overlap with orthogonal projections of wires connected with the left and right pixel unit groups on the base substrate.

As shown in FIG. 12C, the shielding connecting portion SP1 is located between the adjacent first pixel units, and thus, in order to facilitate arranging the shielding connecting portion SP1, the active layer of the second reset transistor in a previous first pixel unit located in the same column of the same pixel unit group extends along the first direction Y1 and is connected with the active layer of the first reset transistor T6 in a next first pixel unit located in the same column. It should be noted that the embodiments of the present disclosure do not make any limit thereto.

Figure 13A:
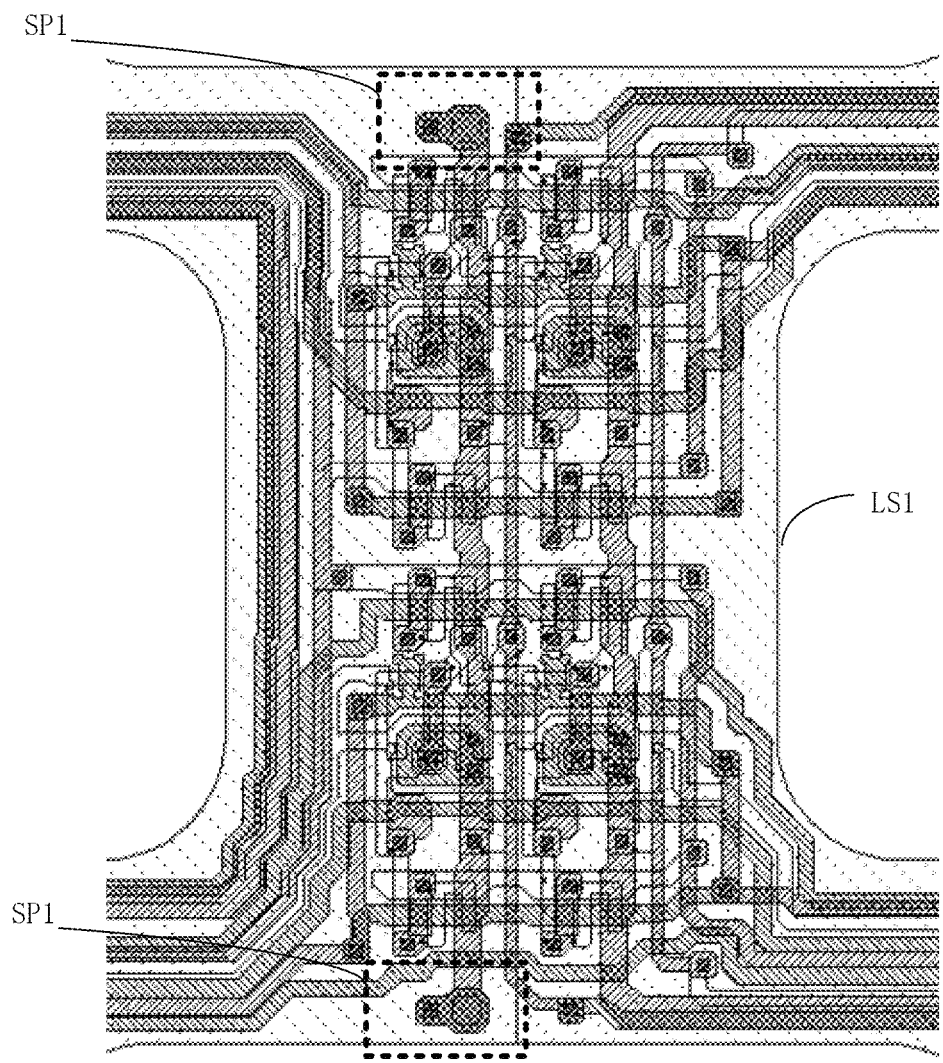
FIG. 13A is a schematic diagram of one example of another display substrate provided by at least one embodiment of the present disclosure.
Figure 13B:
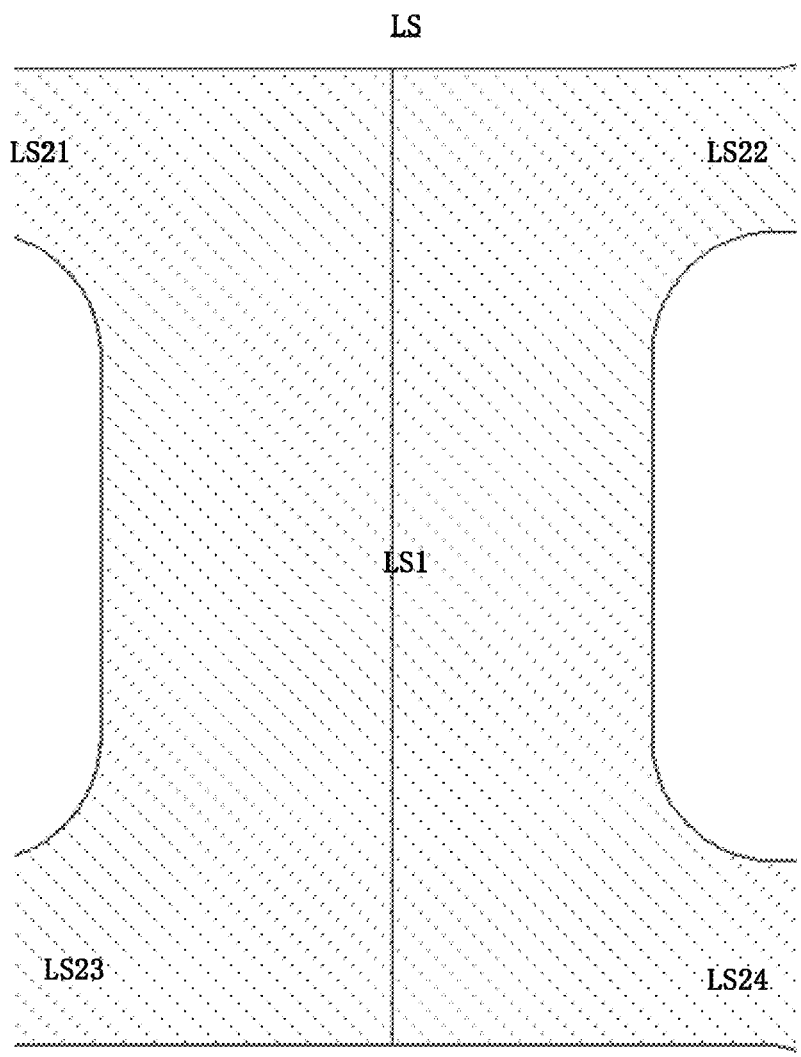
FIG. 13B is a plan view of a shielding region LS1 of a shielding layer LS of the display substrate shown in FIG. 13A.
Figure 13C:
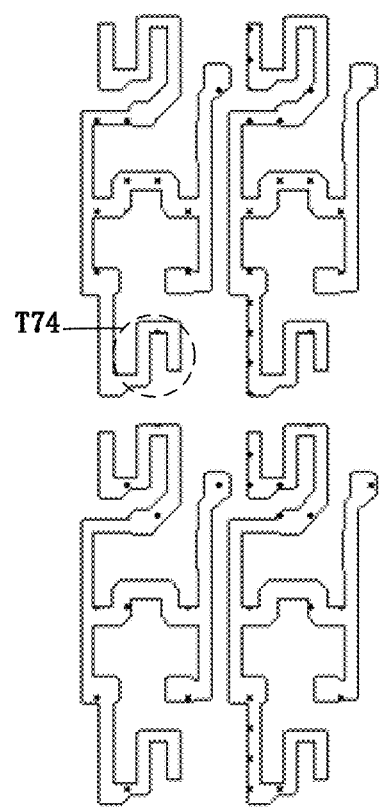
FIG. 13C is a plan view of a semiconductor pattern of the display substrate shown in FIG. 13A.
Figure 13D:
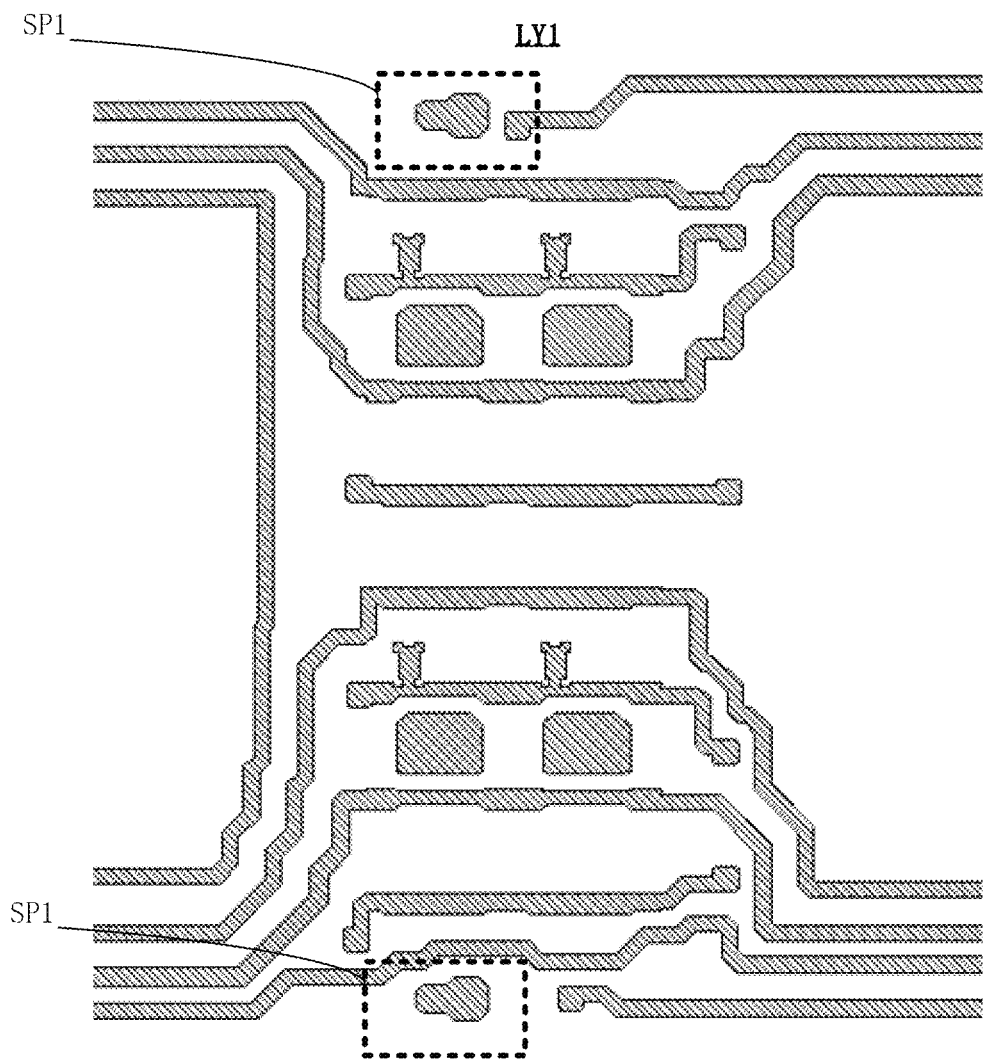
FIG. 13D is a plan view of a first conductive layer of the display substrate shown in FIG. 13A.
Figure 13E:
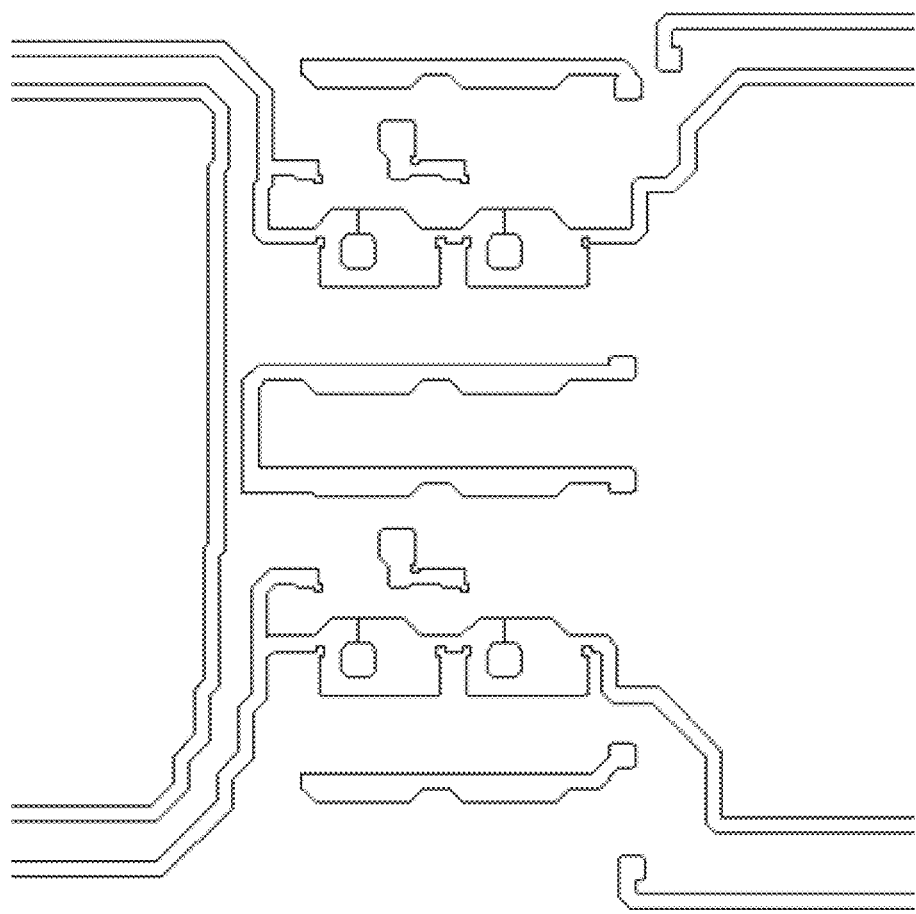
FIG. 13E is a plan view of a second conductive layer of the display substrate shown in FIG. 13A.
Figure 13F:
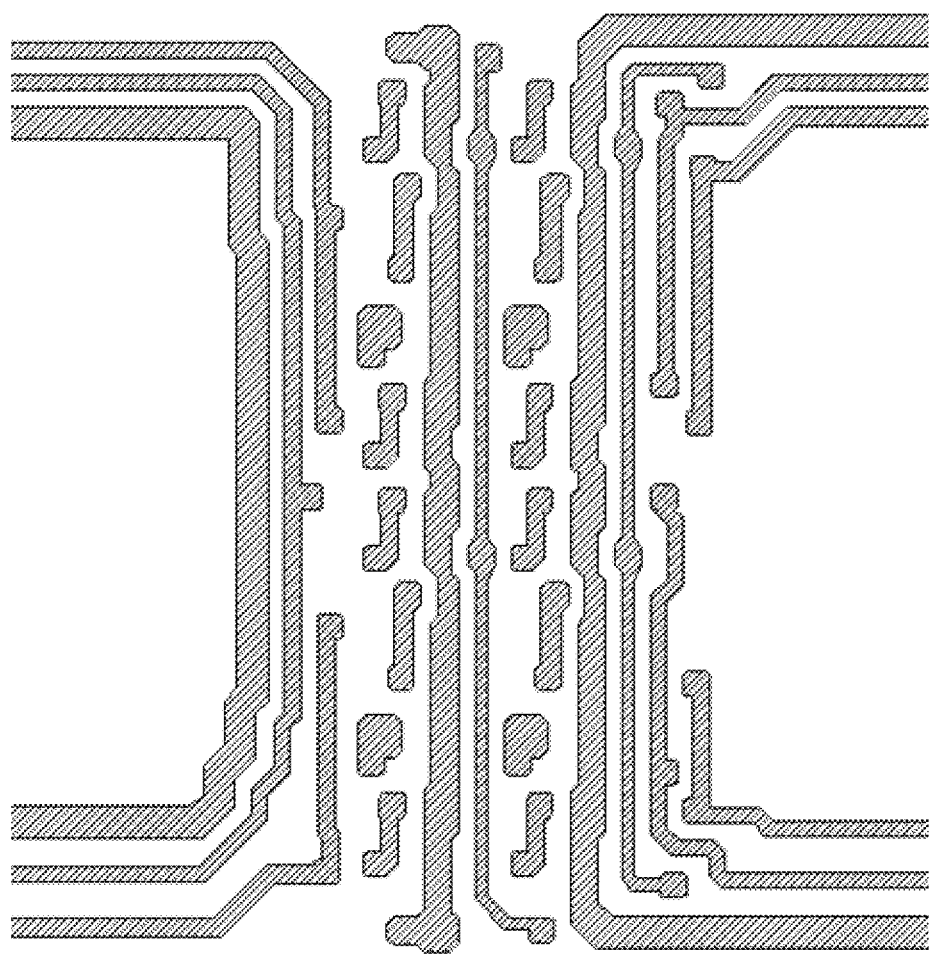
FIG. 13F is a plan view of a third conductive layer of the display substrate shown in FIG. 13A.

FIG. 13A is a schematic diagram of one example of another display substrate provided by at least one embodiment of the present disclosure; FIG. 13B is a plan view of the shielding region LS1 of the shielding layer LS of the display substrate shown in FIG. 13A; FIG. 13C is a plan view of a semiconductor pattern of the display substrate shown in FIG. 13A; FIG. 13D is a plan view of the first conductive layer of the display substrate shown in FIG. 13A; FIG. 13E is a plan view of the second conductive layer of the display substrate shown in FIG. 13A; and FIG. 13F is a plan view of a third conductive layer of the display substrate shown in FIG. 13A.

For example, the display substrate shown in FIG. 13A is similar with the display substrate shown in FIG. 12A, and the difference is that: the first shielding connecting portions SP1 are respectively located at both ends of each pixel unit group and are connected with at least one of a plurality of first power lines VDD1 respectively corresponding to each pixel unit group. For example, the first shielding connecting portions SP1 located at both ends may be both connected with the same first power line VDD1, or may be respectively connected with two different first power lines VDD1 in a plurality of first power lines VDD1 corresponding to the pixel unit group, i.e., two first shielding connecting portions may be both located in the same column, or may be located in different columns, which is not limited in the embodiments of the present disclosure.

As shown in FIG. 13B, the shielding region LS1 merely includes portions LS21, LS22, LS23, and LS24 extending out along the second direction X1 and respectively shielding wires connected with the left and right pixel unit groups. In FIG. 13A, the third conductor connecting the upper and lower pixel unit groups and the first portion and the second portion of the first data line DL1 respectively extend along the second direction X1, and thus, compared with the example in FIG. 12B, the shielding region LS1 shown in FIG. 13B does not include a portion extending along the first direction Y1.

It should be noted that when the shielding connecting portions SP1 are located at both ends, as shown in FIG. 13B, the semiconductor layer of each first pixel unit is consistent, i.e., the first pixel units located in the same column are not connected, and the active layer of the second reset transistor is different from that in FIG. 12C and further includes a bent portion T74.

Figure 14B:
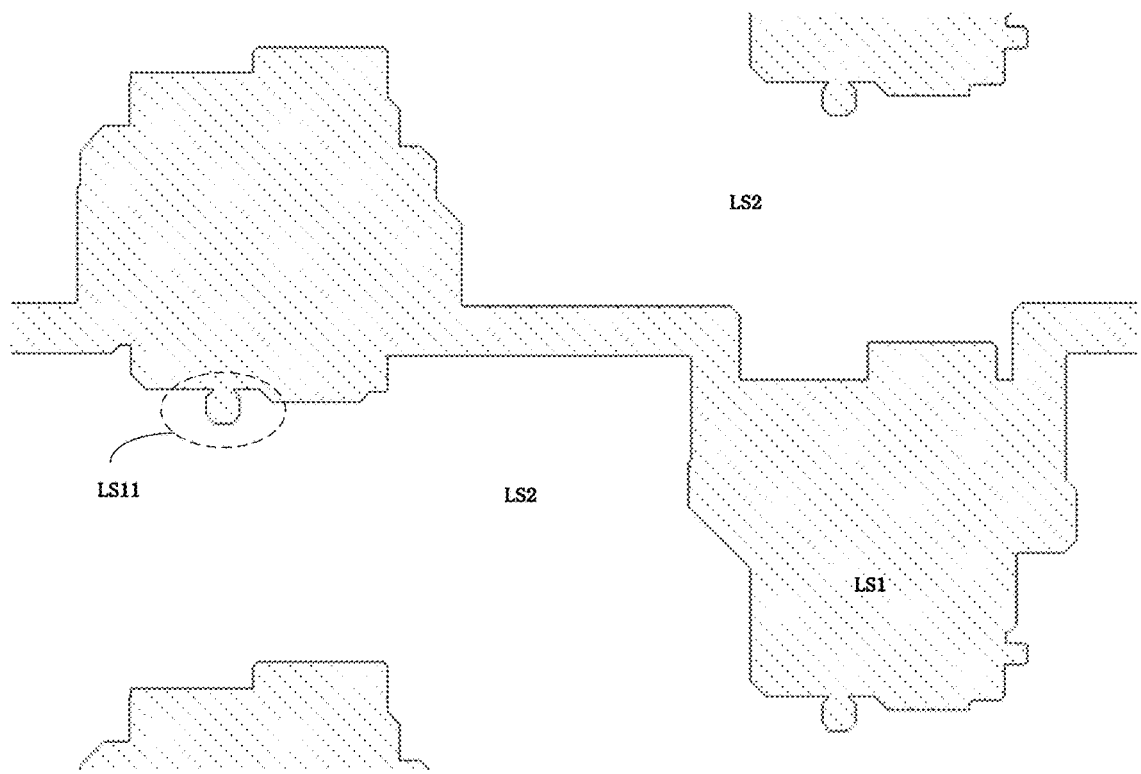
FIG. 14B is a plan view of a shielding region LS1 of a shielding layer LS of the display substrate shown in FIG. 14A.
Figure 14C:
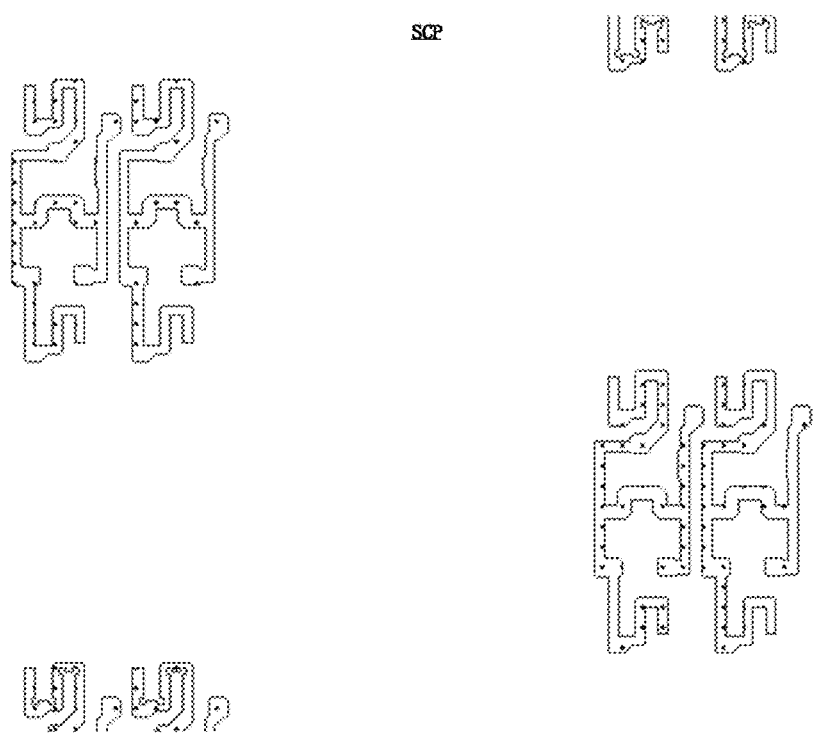
FIG. 14C is a plan view of a semiconductor pattern of the display substrate shown in FIG. 14A.
Figure 14D:
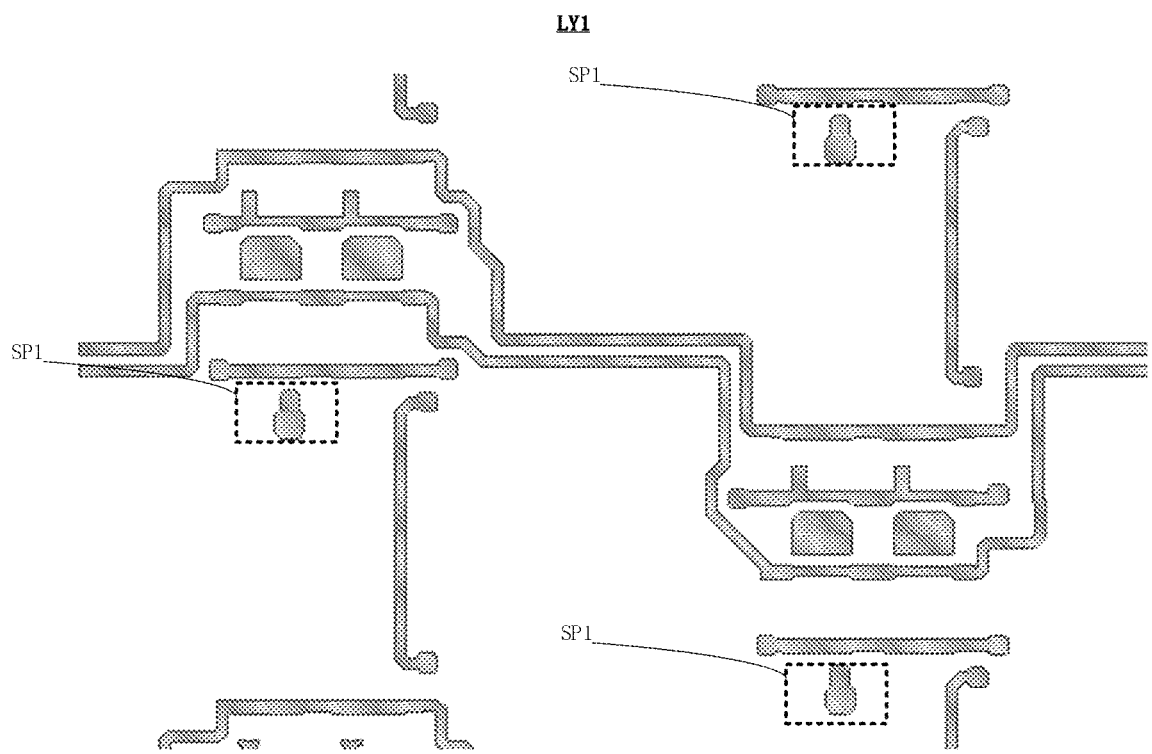
FIG. 14D is a plan view of a first conductive layer of the display substrate shown in FIG. 14A.
Figure 14E:
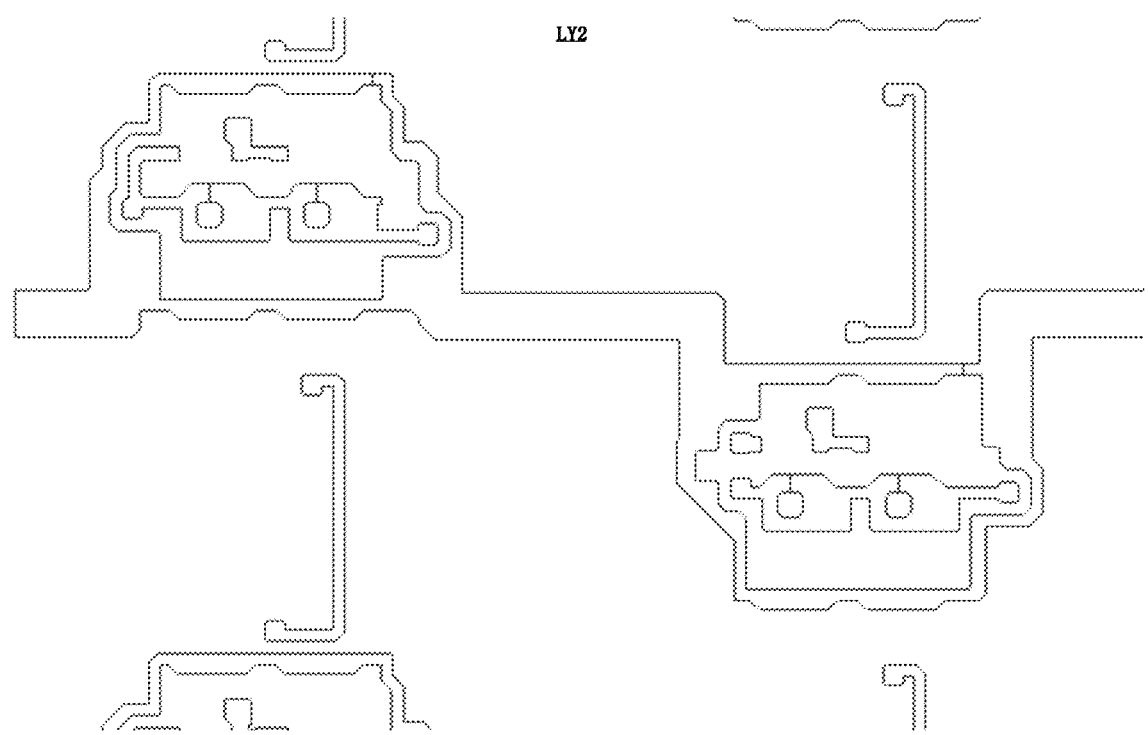
FIG. 14E is a plan view of a second conductive layer of the display substrate shown in FIG. 14A.
Figure 14F:
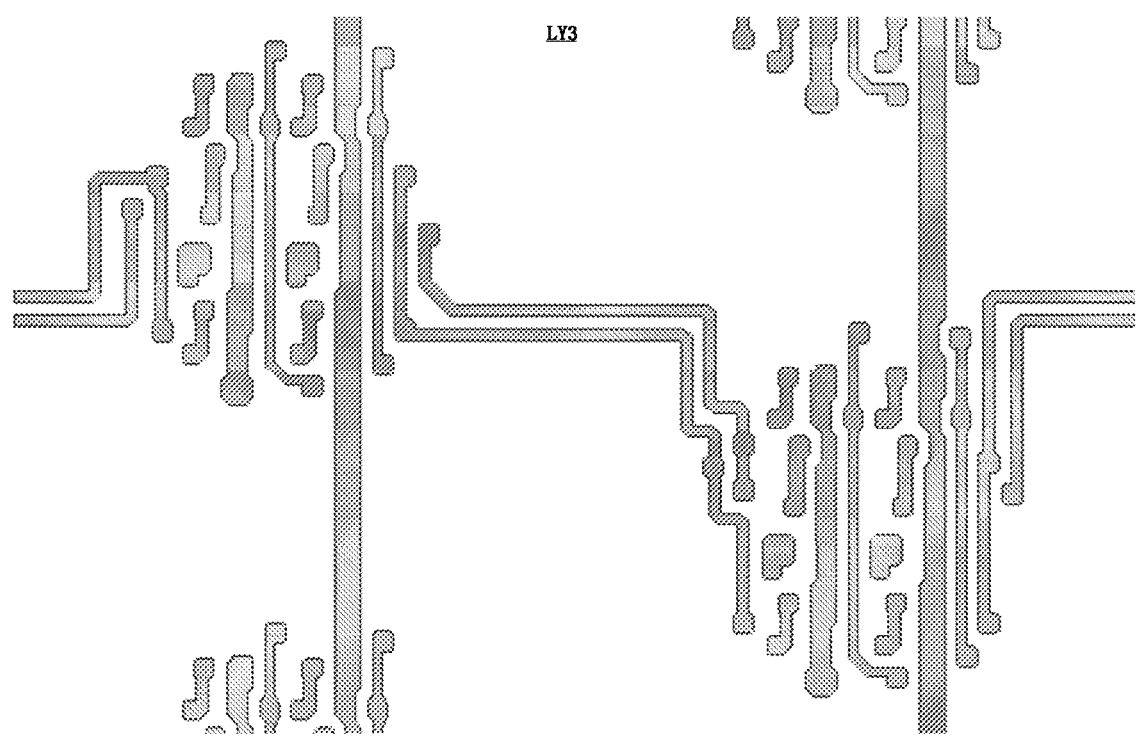
FIG. 14F is a plan view of a third conductive layer of the display substrate shown in FIG. 14A.
Figure 15A:
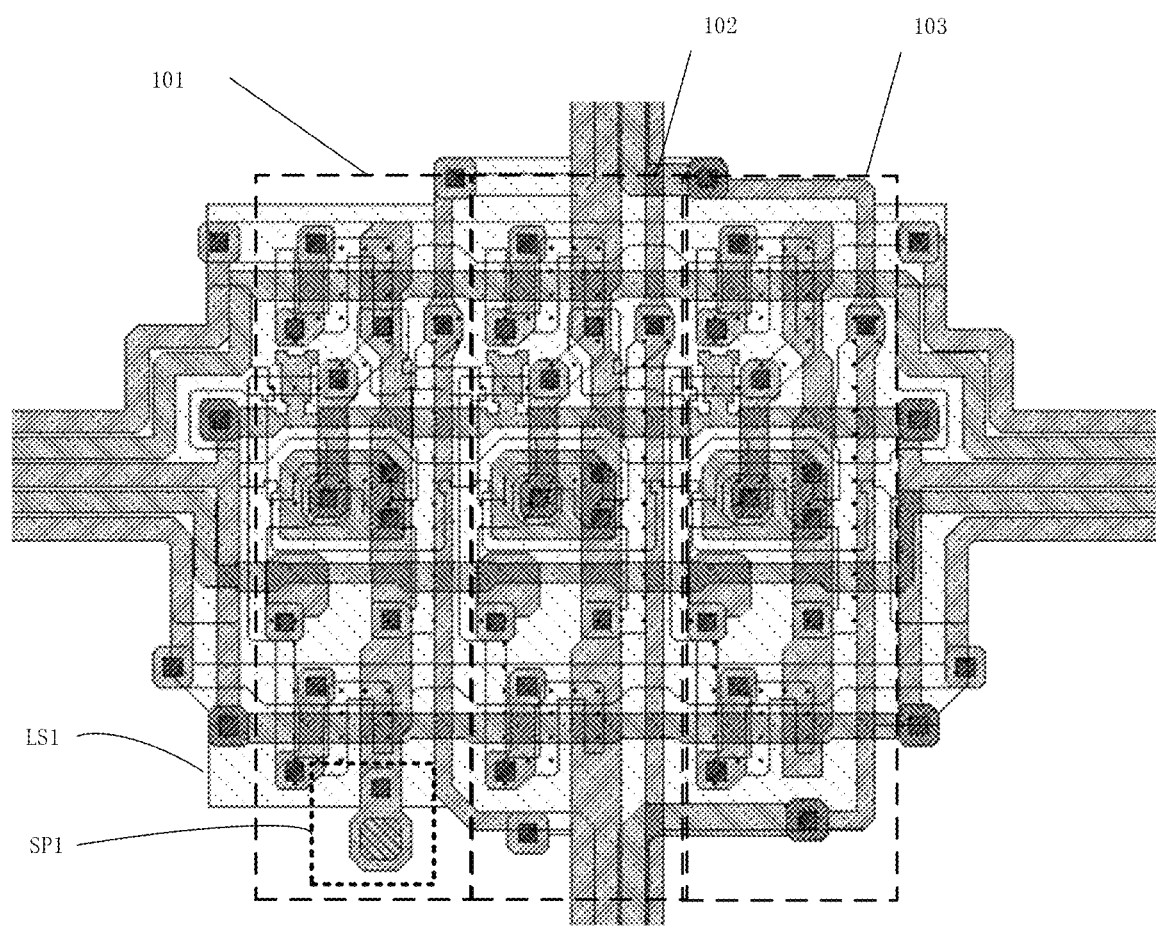
FIG. 15A is a schematic diagram of one example of still a further another display substrate provided by at least one embodiment of the present disclosure.
Figure 15B:
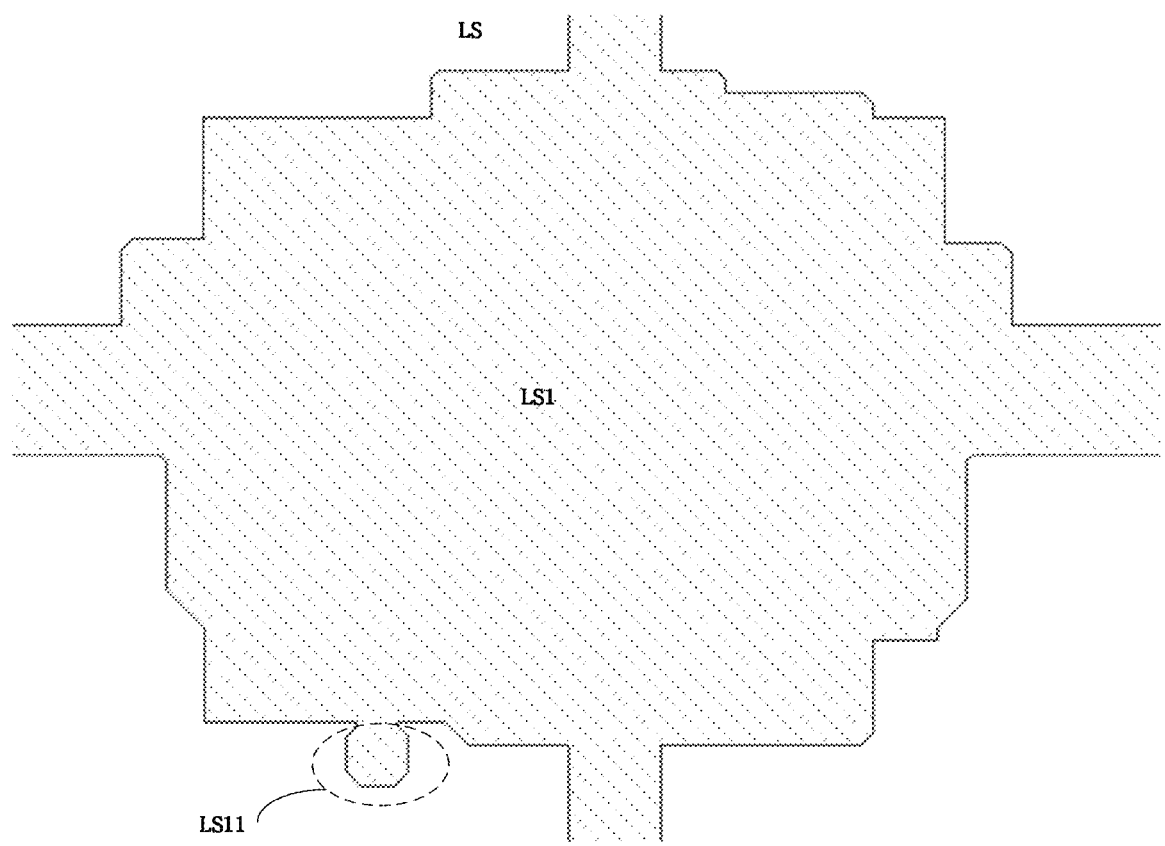
FIG. 15B is a plan view of a shielding region LS1 of a shielding layer LS of the display substrate shown in FIG. 15A.
Figure 15C:
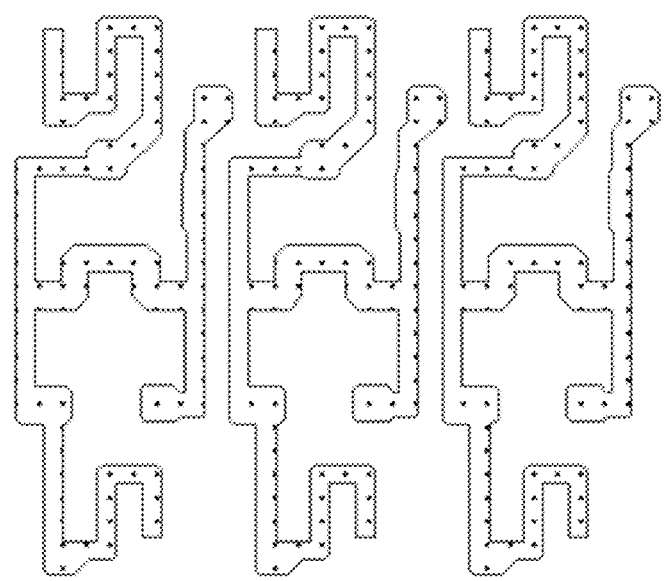
FIG. 15C is a plan view of a semiconductor pattern of the display substrate shown in FIG. 15A.
Figure 15D:
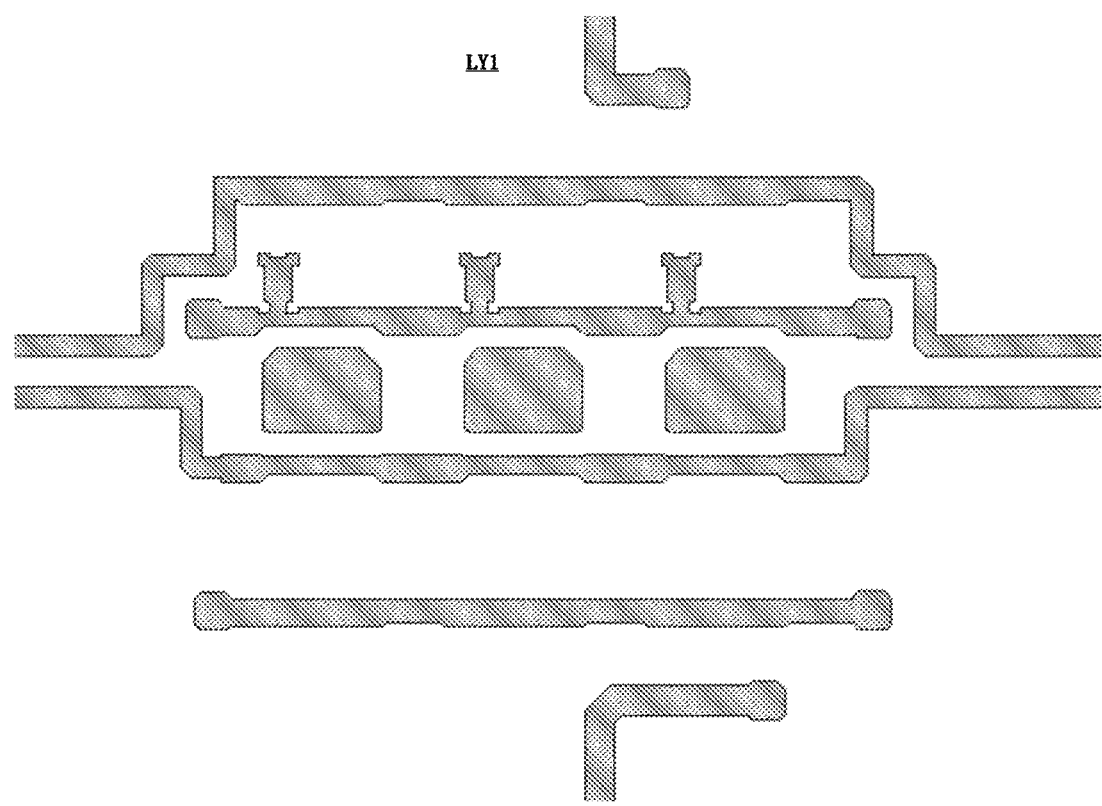
FIG. 15D is a plan view of a first conductive layer of the display substrate shown in FIG. 15A.
Figure 15E:
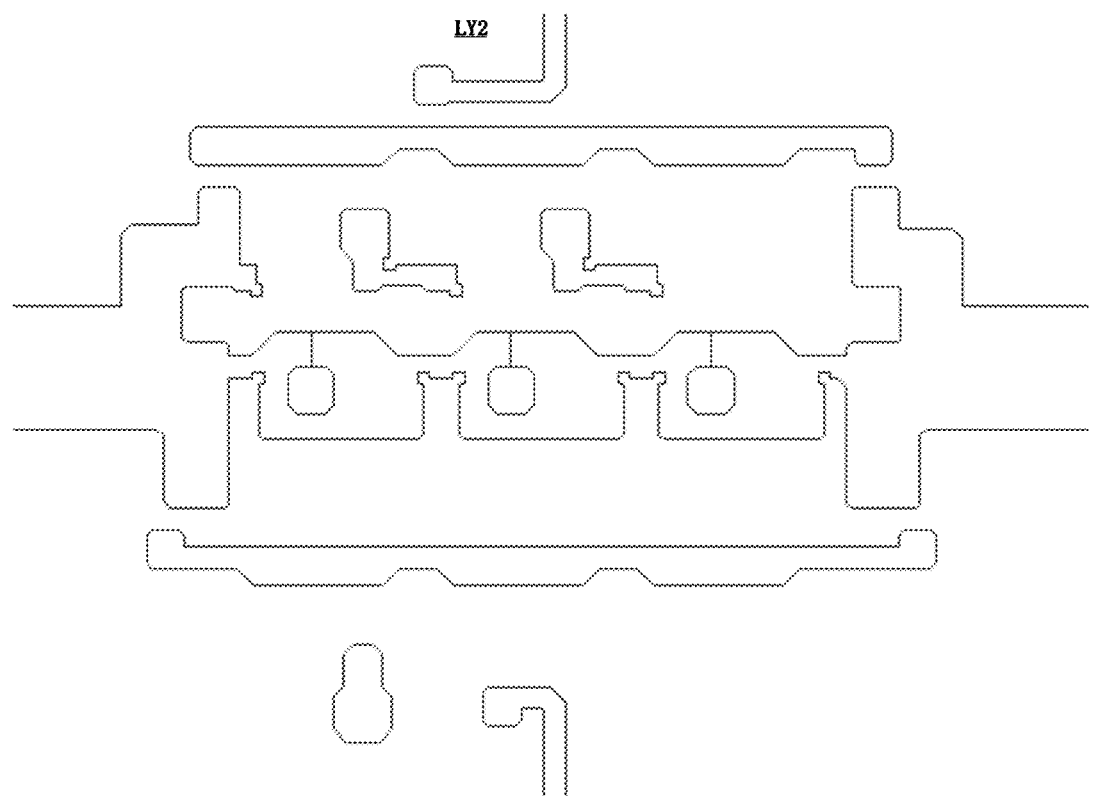
FIG. 15E is a plan view of a second conductive layer of the display substrate shown in FIG. 15A.
Figure 15F:
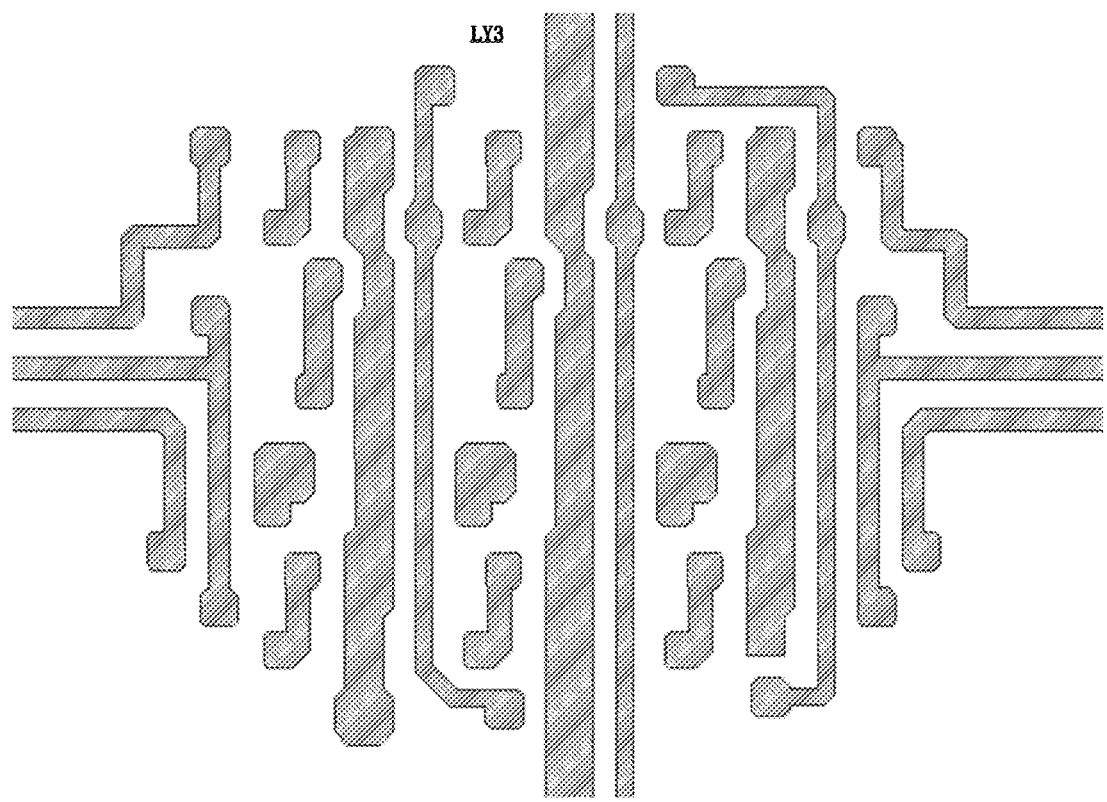
FIG. 15F is a plan view of a third conductive layer of the display substrate shown in FIG. 15A.

FIG. 14A is a schematic diagram of one example of yet another display substrate provided by at least one embodiment of the present disclosure; FIG. 14B is a plan view of the shielding region LS1 of the shielding layer LS of the display substrate shown in FIG. 14A; FIG. 14C is a plan view of the semiconductor pattern of the display substrate shown in FIG. 14A; FIG. 14D is a plan view of the first conductive layer of the display substrate shown in FIG. 14A; FIG. 14E is a plan view of the second conductive layer of the display substrate shown in FIG. 14A; and FIG. 14F is a plan view of the third conductive layer of the display substrate shown in FIG. 14A. FIG. 15A is a schematic diagram of one example of still a further display substrate provided by at least one embodiment of the present disclosure; FIG. 15B is a plan view of the shielding region LS1 of the shielding layer LS of the display substrate shown in FIG. 15A; FIG. 15C is a plan view of the semiconductor pattern of the display substrate shown in FIG. 15A; FIG. 15D is a plan view of the first conductive layer of the display substrate shown in FIG. 15A; FIG. 15E is a plan view of the second conductive layer of the display substrate shown in FIG. 15A; and FIG. 15F is a plan view of the third conductive layer of the display substrate shown in FIG. 15A.

For example, as shown in FIG. 14A, one pixel unit group includes two first pixel units 101 and 102. For example, as shown in FIG. 15A, one pixel unit group includes three first pixel units 101, 102, and 103.

The shielding region in FIG. 15B is similar with the shielding region in FIG. 12B and is different in further including a protruding portion, and the same portions are not repeated herein.

For example, as shown in FIG. 14A and FIG. 15A, the first shielding connecting portion SP1 is respectively located at one end of each pixel unit group and connected with at least one of a plurality of first power lines VDD1 corresponding to the pixel unit group. For example, the first shielding connecting portion SP1 is connected with the first power line VDD1 connected with the first pixel unit 101, and the embodiments of the present disclosure do not make any limit thereto.

For example, as shown in FIG. 14B, when the first shielding connecting portions SP1 are respectively located at one end or both ends of each pixel unit group, the shielding region LS1 of the shielding layer LS further includes a protruding portion LS11 for overlapping with the first shielding connecting portion SP1, so that the phenomena of diffraction of light and the like can be avoided.

It should be noted that each embodiment above merely schematically shows the number and the positions of the first shielding connecting portions SP1; certainly, with regard to the display substrates in different embodiments, the number of the corresponding first shielding connecting portions SP1 also may be greater or smaller, and the positions also may be changed; and the embodiments of the present disclosure do not make any limit thereto.

It should be noted that a mode of connecting a second shielding portion SP2 in the second display region 20 with the shielding layer LS and the second power line VDD2 is basically the same with that of connecting the first shielding portion SP1 in the first display region 10, specifically may refer to related description in FIG. 7 and FIG. 12A to FIG. 15F, and is not repeated herein. For example, each second pixel unit C in the second display region 20 corresponds to one second shielding portion, so that the ELVDD signal is connected to the shielding layer LS in each pixel circuit, the stable direct-current signal is input to the shielding layer LD, and a wide-range ELVDD signal network is formed in the overall display region, thereby benefiting for reducing the wire voltage drop, improving display uniformity and improving the display effect. Meanwhile, the shielding layer LS of the first display region 10 and the shielding layer LS of the second display region 20 are connected and integrally formed so as to form one overall ELVDD signal network, thereby reducing the wire voltage drop of the power lines (i.e., the first power line VDD1 and the second power line VDD2) which provide the ELVDD signal and improving the display effect.

Figure 16:
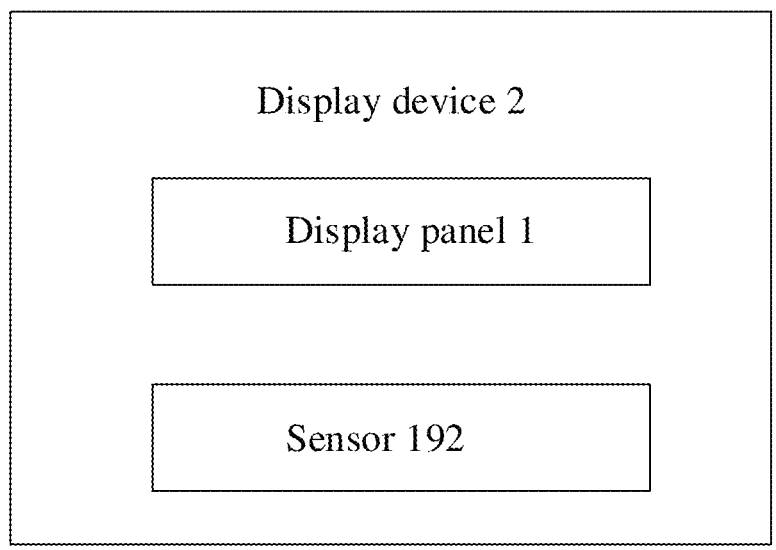
FIG. 16 is a schematic diagram of a display device provided by at least one embodiment of the present disclosure.

FIG. 16 is a schematic diagram of a display device provided by at least one embodiment of the present disclosure. At least one embodiment of the present disclosure provides a display device 2. The display device 2 may include the display substrate 1 provided by any one of the embodiments above.

For example, as shown in FIG. 16, the display device 2 further may include a flexible circuit board and a control chip. For example, the flexible circuit board is bonded to a bonding region of the display substrate 1, and the control chip is mounted on the flexible circuit board and thus is electrically connected with the display region; or the control chip is directly bonded to the bonding region and thus is electrically connected with the display region.

For example, the control chip may be a central processing unit, a digital signal processor, a System On Chip (SoC), and the like. For example, the control chip further may include a memory, also may include a power module and the like, and achieves functions of power supply and signal input and output through additionally arranged conductor wires, signal lines and the like. For example, the control chip further may include a hardware circuit, a computer executable code, and the like. The hardware circuit may include a conventional Very Large Scale Integration (VISI) circuit, a gate array, existing semiconductors such as a logic chip, a transistor and so on, or other discrete elements; and the hardware circuit further may include a Field Programmable Gate Array (FPGA), a programmable array logic, a programmable logic device, and the like.

For example, the display device 2 provided by at least one embodiment of the present disclosure may be any product or part with the display function, such as an OLED panel, an OLED television, an QLED panel, an QLED television, a mobile phone, a tablet personal computer, a notebook computer, a digital photo frame, a navigator, and the like. The display device 2 further may include other parts, e.g., a data driving circuit, a timing controller, and the like, and the embodiments of the present disclosure do not make any limit thereto.

For example, as shown in FIG. 16 and FIG. 1, the display device 2 further includes a sensor 192. The sensor 192 is arranged on the second side S2 (e.g., the non-display side) of the display substrate 1. The sensor 192 is configured to receive light (e.g., collimated light or uncollimated light) from the first side S1 (e.g., the display side of the display substrate) of the display substrate 1. An orthogonal projection of the sensor 192 on the base substrate 100 at least partially overlaps with the first display region 10.

For example, the sensor 192 is an image sensor, an infrared sensor, a distance sensor, and the like. The sensor 192, for example, may be implemented in a form of a chip and the like. The sensor 192 is arranged on the non-display side S2 (one side deviated from the user) of the display substrate.

For example, the sensor 192 and the first display region 10 at least partially overlap in the normal direction of the display face of the display substrate.

For example, the sensor 192 may be the image sensor, may be used for acquiring an image of an external environment which is faced by a light collecting surface of the sensor 192, and for example, may be a CMOS image sensor or a CCD image sensor; and the sensor 192 also may be the infrared sensor, the distance sensor, and the like. The sensor 192 may be used for implementing a camera of a mobile terminal such as the mobile phone and the notebook computer, and as required, also may include optical members such as a lens, a reflector or an optical waveguide, and the like so as to carry out modulation on a light path. The embodiments of the present disclosure do not make any limit to the type, function and setting mode of the sensor 192.

The sensor 192 is arranged on the non-display side S2 of the display panel in a mode of a double-sided adhesive and the like, the orthogonal projection of the sensor 192 on the base substrate 100 at least partially overlaps with the first display region 10, and the sensor 192 is configured to receive the light from the first side S1. Therefore, while implementing display, the first display region 10 also provides convenience for arrangement of the sensor 192.

It should be noted that, for the sake of clarity and conciseness, the embodiments of the present disclosure do not provide all the constituent units of the display device. In order to realize the base function of the display device, those skilled in the art may provide or set other structures not shown according to specific needs, which are not limited by the embodiments of the present disclosure.

Regarding to the technical effect of the display device provided by the above-mentioned embodiments, reference may be made to the technical effect of the display substrate provided by the embodiments of the present disclosure, which will not be repeated here.

The following statements should be noted:

(1) Unless otherwise defined, the same reference number is denoted as the same meaning in the embodiments of the accompanying drawings of the present disclosure.

(2) The accompanying drawings involve only the structure(s) in connection with the embodiment(s) of the present disclosure, and other structure(s) can be referred to common design(s).

The above disclosure are only specific embodiments of the present disclosure, but the protection scope of the present disclosure is not limited to this. Changes or substitutions which can be easily thought of by any of those skilled in the art within the technical scope disclosed by the present disclosure should be included within the protection scope of the present disclosure. Therefore, the protection scope of the present disclosure should be based on the protection scope of the claims.

The invention claimed is:

1. A display substrate, having a first side for displaying and a second side opposite to the first side, comprising:
 a base substrate;
 a display region, disposed on the base substrate and includes a first display region and a second display region at least partially surrounding the first display region, wherein the first display region allows light from the first side of the display substrate to be at least partially transmitted to the second side of the display substrate for sensing, the first display region includes a plurality of pixel unit groups arranged at intervals, each of the plurality of pixel unit groups includes a plurality of first pixel units, and each of the plurality of first pixel units includes a pixel region and an opening region;

a plurality of first power lines, located in the pixel region and configured to be connected with the plurality of pixel unit groups, to provide a first power voltage to the plurality of pixel unit groups; and a shielding layer, disposed on the base substrate, located on a side of the plurality of first power lines close to the base substrate, and including a hollow region and a shielding region, wherein for one pixel unit group of the plurality of pixel unit groups, the opening region of each of the plurality of first pixel units at least partially overlaps with the shielding region of the shielding layer, the opening region of at least one of the plurality of first pixel units includes a first shielding connecting portion at least partially overlapping with the shielding region of the shielding layer, the shielding layer is connected with at least one of the plurality of first power lines through the first shielding connecting portion, to receive the first power voltage; and the plurality of first power lines are located on a side of the first shielding connecting portion away from the base substrate, the shielding layer is located on a side of the first shielding connecting portion close to the base substrate, and the first shielding connecting portion is located between the shielding layer and the plurality of first power lines.

2. The display substrate according to claim 1, wherein the shielding layer is connected with the first shielding connecting portion through a first through hole and the first shielding connecting portion is connected with the at least one of the plurality of first power lines through a second through hole.

3. The display substrate according to claim 2, further comprising a first insulating layer, a second insulating layer and a third insulating layer, wherein the first insulating layer is located between the shielding layer and the first shielding connecting portion, the second insulating layer is located between the first insulating layer and the first shielding connecting portion and the third insulating layer is located between the first shielding connecting portion and the plurality of first power lines; or, the second insulating layer is located between the first shielding connecting portion and the plurality of first power lines, the third insulating layer is located between the second insulating layer and the plurality of first power lines, the shielding layer is connected with the first shielding connecting portion by the first through hole passing through the first insulating layer and the first shielding connecting portion is connected with the at least one of the plurality of first power lines by the second through hole passing through the second insulating layer and the third insulating layer; or, the shielding layer is connected with the first shielding connecting portion by the first through hole passing through the first insulating layer and the second insulating layer and the first shielding connecting portion is connected with the at least one of the plurality of first power lines by the second through hole passing through the third insulating layer.

4. The display substrate according to claim 3, wherein orthogonal projections of the first through hole and the second through hole on the base substrate do not overlap; and the first power line includes a protruding portion, an orthogonal projection of the second through hole on the base substrate overlaps with an orthogonal projection of the protruding portion on the base substrate, and an orthogonal projection of the first through hole on the base substrate overlaps with an orthogonal projection of the first power line on the base substrate.

5. The display substrate according to claim 1, wherein the adjacent pixel unit groups are connected through a wire, and orthogonal projections of the plurality of pixel unit groups and the wire on the base substrate fall within an orthogonal projection of the shielding region of the shielding layer on the base substrate.

6. The display substrate according to claim 1, wherein the second display region includes a plurality of second pixel units arranged in an array and a plurality of second power lines and each of the plurality of second pixel units includes a pixel region and an opening region; and the plurality of second power lines are configured to be connected with the plurality of second pixel units, to provide a second power voltage to the plurality of second pixel units, and the second power voltage is a same with the first power voltage, wherein for one of the plurality of second pixel units, the opening region of each of the plurality of second pixel units at least partially overlaps with the shielding region of the shielding layer, the opening region of the at least one of the plurality of second pixel units includes a second shielding connecting portion and the second shielding connecting portion at least partially overlaps with the shielding region of the shielding layer.

7. The display substrate according to claim 1, wherein an orthogonal projection of the second display region on the base substrate falls within the orthogonal projection of the shielding region of the shielding layer on the base substrate.

8. The display substrate according to claim 1, wherein each of the plurality of first pixel units and the plurality of second pixel units includes a pixel driving circuit and a light-emitting member and the pixel driving circuit is configured to drive the light-emitting member to emit light.

9. The display substrate according to claim 8, wherein the pixel driving circuit includes a driving transistor, a data writing transistor, a compensation transistor, a first light-emitting control transistor, a second light-emitting control transistor, a first reset transistor, a second reset transistor, and a storage capacitor, wherein active layers of the first reset transistor, the compensation transistor, the second light-emitting control transistor, and the second reset transistor are located in a first semiconductor layer extending along a first direction, active layers of the data writing transistor and the first light-emitting control transistor are located in a second semiconductor layer extending along a second direction, the first semiconductor layer and the second semiconductor layer are connected through an active layer of the driving transistor and integrally formed, the active layer of the driving transistor is located on an imaginary line of the active layer of the first reset transistor in the first direction, the active layers of the compensation transistor and the data writing transistor are respectively located on both sides of the active layer of the driving transistor and located on a side of the active layer of the driving transistor close to the active layer of the first reset transistor, the active layers of the second light-emitting control transistor and the first light-emitting control transistor are respectively located on both sides of the active layer of the driving transistor and located on a side of the active layer of the driving transistor away from the active layer of the first reset transistor, the active layer of the second reset transistor is located on a side of the active layer of the second light-emitting control transistor away from the active layer of the compensation transistor, the compensation transistor includes a first gate electrode extending along the first direction and a second gate electrode extending along the second direction, the second gate electrode is arranged in the first direction side by side with a gate electrode of the second light-emitting control transistor and a gate electrode of the second reset transistor which extend along the second direction, a gate electrode of the data writing transistor and a gate electrode of the first light-emitting control transistor extend along the second direction and are arranged side by side in the first direction, a gate electrode of the first reset transistor and a gate electrode of the driving transistor extend along the second direction and are arranged side by side in the first direction, and the gate electrode of the driving transistor and a first polar plate of the storage capacitor are integrally formed.

10. The display substrate according to claim 9, further comprising a gate line, a light-emitting control signal line, a first reset signal line, and a second reset signal line which extend along the second direction, wherein the gate electrode of the first reset transistor and the first reset signal line are connected and integrally formed, the second gate electrode of the compensation transistor and the gate electrode of the data writing transistor are connected with the gate line and are integrally formed with the gate line, the gate electrode of the second light-emitting control transistor and the gate electrode of the first light-emitting control transistor are connected with the light-emitting control signal line and are integrally formed with the light-emitting control signal line, and the gate electrode of the second reset transistor and the second reset signal line are connected and integrally formed.

11. The display substrate according to claim 10, further comprising a data line, wherein the data line is connected with the active layer of the data writing transistor and configured to provide a data signal, the orthogonal projection of the first power line on the base substrate at least partially overlaps with orthogonal projections of the active layer of the first reset transistor and the active layer of the driving transistor on the base substrate, and an orthogonal projection of the data line on the base substrate is located on a side of an orthogonal projection of the second semiconductor layer on the base substrate away from the orthogonal projection of the first power line on the base substrate.

12. The display substrate according to claim 11, wherein the pixel driving circuit further includes a first transfer electrode, the first transfer electrode is connected with the active layer of the second light-emitting control transistor, the active layer of the second reset transistor, and a first electrode of the light-emitting member by a through hole, and an orthogonal projection of the first transfer electrode on the base substrate is located between orthogonal projections of the active layer of the second reset transistor and the active layer of the driving transistor on the base substrate.

13. The display substrate according to claim 12, wherein for each of the plurality of second pixel units, an orthogonal projection of the second shielding connecting portion on the base substrate is located between the orthogonal projection of the active layer of the second reset transistor on the base substrate and an orthogonal projection of the second power line on the base substrate and at least partially overlaps with the orthogonal projection of the second power line on the base substrate.

14. The display substrate according to claim 13, wherein for each pixel unit group, the first shielding connecting portion is located between two adjacent first pixel units in the first direction in each pixel unit group.

15. The display substrate according to claim 12, wherein an orthogonal projection of the first shielding connecting portion on the base substrate is located between the orthogonal projection of the active layer of the second reset transistor on the base substrate and an orthogonal projection of the first power line on the base substrate and at least partially overlaps with the orthogonal projection of the first power line on the base substrate.

16. The display substrate according to claim 12, further comprising a fourth insulating layer, a first conductive layer, a second conductive layer, and a third conductive layer, wherein the first conductive layer includes the gate line, the second conductive layer includes a second polar plate of the storage capacitor, the third conductive layer includes the first power line, in a direction perpendicular to the base substrate, the fourth insulating layer is located between the shielding layer and the active layer of the transistor, the first insulating layer is located between the active layer and the first conductive layer, the second insulating layer is located between the gate line and the second conductive layer, and the third insulating layer is located between the second polar plate of the storage capacitor and the third conductive layer.

17. The display substrate according to claim 16, wherein the first shielding connecting portion is located in the first conductive layer or the second conductive layer.

18. The display substrate according to claim 1, wherein the first shielding connecting portions are respectively located at both ends of each pixel unit group and connected with at least one of a plurality of first power lines respectively corresponding to the each pixel unit group.

19. The display substrate according to claim 1, wherein the first shielding connecting portion is respectively located at an end of each pixel unit group and connected with at least one of a plurality of first power lines corresponding to the pixel unit group.

20. A display device, comprising the display substrate according to claim 1 and a sensor, wherein the sensor is arranged on the second side of the display substrate and the sensor is configured to receive light from the first side of the display substrate; and an orthogonal projection of the sensor on the base substrate at least partially overlaps with the first display region.

\* \* \* \* \*

UNITED STATES PATENT AND TRADEMARK OFFICE
CERTIFICATE OF CORRECTION

| | | |
|---|---|---|
| PATENT NO. | : 11,804,176 B2 | Page 1 of 1 |
| APPLICATION NO. | : 17/754108 | |
| DATED | : October 31, 2023 | |
| INVENTOR(S) | : Cong Liu et al. | |

It is certified that error appears in the above-identified patent and that said Letters Patent is hereby corrected as shown below:

On the Title Page

Item (72) Inventors, the third inventors name:
'Jiachang Cai'

Should appear as:
--Jianchang Cai--.

Signed and Sealed this
Twenty-seventh Day of February, 2024

Katherine Kelly Vidal
*Director of the United States Patent and Trademark Office*